US008685794B2

(12) United States Patent
Nondhasitthichai et al.

(10) Patent No.: US 8,685,794 B2
(45) Date of Patent: Apr. 1, 2014

(54) LEAD FRAME LAND GRID ARRAY WITH ROUTING CONNECTOR TRACE UNDER UNIT

(71) Applicant: UTAC Thai Limited, Bangkok (TH)

(72) Inventors: Somchai Nondhasitthichai, Bangkok (TH); Saravuth Sirinorakul, Bangkok (TH); Kasemsan Kongthaworn, Patumthani (TH); Vorajit Suwannaset, Samutprakarn (TH)

(73) Assignee: UTAC Thai Limited, Bangkok (TH)

( * ) Notice: Subject to any disclaimer, the term of this patent is extended or adjusted under 35 U.S.C. 154(b) by 0 days.

(21) Appl. No.: 13/904,975

(22) Filed: May 29, 2013

(65) Prior Publication Data
US 2013/0337609 A1 Dec. 19, 2013

Related U.S. Application Data

(60) Division of application No. 13/040,112, filed on Mar. 3, 2011, now Pat. No. 8,487,451, which is a continuation-in-part of application No. 11/731,522, filed on Mar. 30, 2007, now Pat. No. 8,310,060.

(60) Provisional application No. 60/795,929, filed on Apr. 28, 2006, provisional application No. 61/321,060, filed on Apr. 5, 2010.

(51) Int. Cl.
*H01L 21/00* (2006.01)

(52) U.S. Cl.
USPC ............... 438/112; 438/123; 257/E21.51

(58) Field of Classification Search
USPC ............... 438/112, 123; 257/E21.51
See application file for complete search history.

(56) References Cited

U.S. PATENT DOCUMENTS

| 3,611,061 A | 10/1971 | Segerson |
| 4,411,719 A | 10/1983 | Lindberg |
| 4,501,960 A | 2/1985 | Jouvet et al. |
| 4,801,561 A | 1/1989 | Sankhagowit |
| 4,855,672 A | 8/1989 | Shreeve |
| 5,105,259 A | 4/1992 | McShane et al. |
| 5,195,023 A | 3/1993 | Manzione et al. |
| 5,247,248 A | 9/1993 | Fukunaga |
| 5,248,075 A | 9/1993 | Young et al. |
| 5,281,851 A | 1/1994 | Mills et al. |
| 5,396,185 A | 3/1995 | Honma et al. |
| 5,397,921 A | 3/1995 | Karnezos |
| 5,479,105 A | 12/1995 | Kim et al. |
| 5,535,101 A | 7/1996 | Miles et al. |
| 5,596,231 A | 1/1997 | Combs |
| 5,843,808 A | 12/1998 | Karnezos |
| 5,990,692 A | 11/1999 | Jeong et al. |
| 6,072,239 A | 6/2000 | Yoneda et al. |

(Continued)

OTHER PUBLICATIONS

Michael Quirk and Julian Serda, Semiconductor Manufacturing Technology, Pearson Education International, Pearson Prentice Hall, 2001, pp. 587-588.
Notice of Allowance mailed on Oct. 7, 2013, U.S. Appl. No. 13/603,311, filed Sep. 4, 2012, Somchai Nondhasitthichai et al.
Notice of Allowance mailed on Oct. 11, 2013, U.S. Appl. No. 13/904,931, filed May 29, 2013, Somchai Nondhasitthichai et al.
Office Action mailed Aug. 1, 2013, U.S. Appl. No. 13/904,931, filed May 29, 2013, Somchai Nondhasitthichai et al.

*Primary Examiner* — Lex Malsawma
(74) *Attorney, Agent, or Firm* — Haverstock & Owens LLP

(57) ABSTRACT

A package includes a first plated area, a second plated area, a die attached to the first plated area, and a bond coupling the die to the second plated area. The package further includes a molding encapsulating the die, the bond, and the top surfaces of the first and second plated areas, such that the bottom surfaces of the first and second plated areas are exposed exterior to the package. Additional embodiments include a method of making the package.

20 Claims, 22 Drawing Sheets

(56) References Cited

U.S. PATENT DOCUMENTS

| | | | |
|---|---|---|---|
| 6,111,324 | A | 8/2000 | Sheppard et al. |
| 6,159,770 | A | 12/2000 | Tetaka et al. |
| 6,197,615 | B1 | 3/2001 | Song et al. |
| 6,208,020 | B1 | 3/2001 | Minamio et al. |
| 6,229,200 | B1 | 5/2001 | Mclellan et al. |
| 6,232,650 | B1 | 5/2001 | Fujisawa et al. |
| 6,242,281 | B1 | 6/2001 | Mclellan et al. |
| 6,250,841 | B1 | 6/2001 | Ledingham |
| 6,284,569 | B1 | 9/2001 | Sheppard et al. |
| 6,285,075 | B1 | 9/2001 | Combs et al. |
| 6,294,100 | B1 | 9/2001 | Fan et al. |
| 6,304,000 | B1 | 10/2001 | Isshiki et al. |
| 6,324,754 | B1 * | 12/2001 | DiStefano et al. ............ 29/840 |
| 6,326,678 | B1 | 12/2001 | Karnezos et al. |
| 6,329,711 | B1 | 12/2001 | Kawahara et al. |
| 6,353,263 | B1 * | 3/2002 | Dotta et al. ............ 257/777 |
| 6,372,625 | B1 | 4/2002 | Shigeno et al. |
| 6,376,921 | B1 | 4/2002 | Yoneda et al. |
| 6,392,427 | B1 | 5/2002 | Yang |
| 6,414,385 | B1 | 7/2002 | Huang et al. |
| 6,429,048 | B1 | 8/2002 | McLellan et al. |
| 6,451,709 | B1 | 9/2002 | Hembree |
| 6,452,255 | B1 | 9/2002 | Bayan et al. |
| 6,455,348 | B1 * | 9/2002 | Yamaguchi ............ 438/106 |
| 6,489,218 | B1 | 12/2002 | Kim et al. |
| 6,498,099 | B1 | 12/2002 | McLellan et al. |
| 6,507,116 | B1 | 1/2003 | Caletka et al. |
| 6,545,332 | B2 | 4/2003 | Huang |
| 6,545,347 | B2 | 4/2003 | McClellan |
| 6,552,417 | B2 | 4/2003 | Combs |
| 6,552,423 | B2 | 4/2003 | Song et al. |
| 6,566,740 | B2 | 5/2003 | Yasunaga et al. |
| 6,573,121 | B2 | 6/2003 | Yoneda et al. |
| 6,585,905 | B1 | 7/2003 | Fan et al. |
| 6,586,834 | B1 | 7/2003 | Sze et al. |
| 6,635,957 | B2 | 10/2003 | Kwan et al. |
| 6,667,191 | B1 | 12/2003 | McLellan et al. |
| 6,683,368 | B1 | 1/2004 | Mostafazadeh |
| 6,686,667 | B2 | 2/2004 | Chen et al. |
| 6,703,696 | B2 | 3/2004 | Ikenaga et al. |
| 6,723,585 | B1 | 4/2004 | Tu et al. |
| 6,724,071 | B2 | 4/2004 | Combs |
| 6,734,044 | B1 | 5/2004 | Fan et al. |
| 6,734,552 | B2 | 5/2004 | Combs et al. |
| 6,737,755 | B1 | 5/2004 | McLellan et al. |
| 6,764,880 | B2 | 7/2004 | Wu et al. |
| 6,781,242 | B1 | 8/2004 | Fan et al. |
| 6,800,948 | B1 | 10/2004 | Fan et al. |
| 6,812,552 | B2 | 11/2004 | Islam et al. |
| 6,818,472 | B1 | 11/2004 | Fan et al. |
| 6,818,978 | B1 | 11/2004 | Fan |
| 6,818,980 | B1 | 11/2004 | Pedron, Jr. |
| 6,841,859 | B1 | 1/2005 | Thamby et al. |
| 6,876,066 | B2 | 4/2005 | Fee et al. |
| 6,894,376 | B1 | 5/2005 | Mostafazadeh et al. |
| 6,897,428 | B2 | 5/2005 | Minamio et al. |
| 6,927,483 | B1 | 8/2005 | Lee et al. |
| 6,933,176 | B1 | 8/2005 | Kirloskar et al. |
| 6,933,594 | B2 | 8/2005 | McLellan et al. |
| 6,940,154 | B2 | 9/2005 | Pedron et al. |
| 6,946,324 | B1 | 9/2005 | McLellan et al. |
| 6,964,918 | B1 | 11/2005 | Fan et al. |
| 6,967,126 | B2 | 11/2005 | Lee et al. |
| 6,979,594 | B1 | 12/2005 | Fan et al. |
| 6,982,491 | B1 | 1/2006 | Fan et al. |
| 6,984,785 | B1 | 1/2006 | Diao et al. |
| 6,989,294 | B1 | 1/2006 | McLellan et al. |
| 6,995,460 | B1 | 2/2006 | McLellan et al. |
| 7,008,825 | B1 | 3/2006 | Bancod et al. |
| 7,009,286 | B1 | 3/2006 | Kirloskar et al. |
| 7,049,177 | B1 | 5/2006 | Fan et al. |
| 7,060,535 | B1 | 6/2006 | Sirinorakul et al. |
| 7,071,545 | B1 | 7/2006 | Patel et al. |
| 7,091,581 | B1 | 8/2006 | McLellan et al. |
| 7,101,210 | B2 | 9/2006 | Lin et al. |
| 7,102,210 | B2 | 9/2006 | Ichikawa |
| 7,205,178 | B2 | 4/2007 | Shiu et al. |
| 7,224,048 | B1 | 5/2007 | McLellan et al. |
| 7,247,526 | B1 | 7/2007 | Fan et al. |
| 7,259,678 | B1 | 8/2007 | Brown et al. |
| 7,274,088 | B2 | 9/2007 | Wu et al. |
| 7,314,820 | B2 | 1/2008 | Lin et al. |
| 7,315,077 | B2 | 1/2008 | Choi et al. |
| 7,315,080 | B1 | 1/2008 | Fan et al. |
| 7,342,305 | B1 | 3/2008 | Diao et al. |
| 7,344,920 | B1 | 3/2008 | Kirloskar et al. |
| 7,348,663 | B1 | 3/2008 | Kirloskar et al. |
| 7,358,119 | B2 | 4/2008 | McLellan et al. |
| 7,371,610 | B1 | 5/2008 | Fan et al. |
| 7,372,151 | B1 | 5/2008 | Fan et al. |
| 7,381,588 | B1 | 6/2008 | Patel et al. |
| 7,399,658 | B2 | 7/2008 | Shim et al. |
| 7,408,251 | B2 | 8/2008 | Hata et al. |
| 7,411,289 | B1 | 8/2008 | McLellan et al. |
| 7,449,771 | B1 | 11/2008 | Fan et al. |
| 7,482,690 | B1 | 1/2009 | Fan et al. |
| 7,495,319 | B2 | 2/2009 | Fukuda et al. |
| 7,595,225 | B1 | 9/2009 | Fan et al. |
| 7,608,482 | B1 | 10/2009 | Bayan et al. |
| 7,608,484 | B2 | 10/2009 | Lange et al. |
| 7,709,857 | B2 | 5/2010 | Kim et al. |
| 7,714,418 | B2 | 5/2010 | Lim et al. |
| 7,790,500 | B2 | 9/2010 | Ramos et al. |
| 2001/0008305 | A1 | 7/2001 | McLellan et al. |
| 2002/0109214 | A1 | 8/2002 | Minamio et al. |
| 2003/0006055 | A1 | 1/2003 | Chien-Hung et al. |
| 2003/0045032 | A1 | 3/2003 | Abe |
| 2003/0071333 | A1 | 4/2003 | Matsuzawa |
| 2003/0143776 | A1 | 7/2003 | Pedron, Jr. et al. |
| 2003/0178719 | A1 | 9/2003 | Combs et al. |
| 2003/0201520 | A1 | 10/2003 | Knapp et al. |
| 2003/0207498 | A1 | 11/2003 | Islam et al. |
| 2004/0014257 | A1 | 1/2004 | Kim et al. |
| 2004/0026773 | A1 | 2/2004 | Koon et al. |
| 2004/0046237 | A1 | 3/2004 | Abe et al. |
| 2004/0046241 | A1 | 3/2004 | Combs et al. |
| 2004/0070055 | A1 | 4/2004 | Punzalan et al. |
| 2004/0080025 | A1 | 4/2004 | Kasahara et al. |
| 2004/0110319 | A1 * | 6/2004 | Fukutomi et al. ............ 438/106 |
| 2005/0003586 | A1 | 1/2005 | Shimanuki et al. |
| 2005/0046023 | A1 | 3/2005 | Takahashi et al. |
| 2005/0077613 | A1 | 4/2005 | McLellan et al. |
| 2005/0236701 | A1 | 10/2005 | Minamio et al. |
| 2005/0263864 | A1 | 12/2005 | Islam et al. |
| 2006/0071351 | A1 | 4/2006 | Lange |
| 2006/0192295 | A1 | 8/2006 | Lee et al. |
| 2006/0223229 | A1 | 10/2006 | Kirloskar et al. |
| 2006/0223237 | A1 | 10/2006 | Combs et al. |
| 2006/0273433 | A1 | 12/2006 | Itou et al. |
| 2007/0001278 | A1 | 1/2007 | Jeon et al. |
| 2007/0013038 | A1 | 1/2007 | Yang |
| 2007/0029540 | A1 | 2/2007 | Kajiwara et al. |
| 2007/0200210 | A1 | 8/2007 | Zhao et al. |
| 2007/0235217 | A1 | 10/2007 | Workman |
| 2008/0048308 | A1 | 2/2008 | Lam |
| 2008/0096046 | A1 | 4/2008 | Yamashita et al. |
| 2008/0150094 | A1 | 6/2008 | Anderson |
| 2008/0258278 | A1 | 10/2008 | Ramos et al. |
| 2009/0152694 | A1 | 6/2009 | Bemmert et al. |
| 2009/0230525 | A1 | 9/2009 | Chang Chien et al. |
| 2009/0236713 | A1 | 9/2009 | Xu et al. |
| 2010/0133565 | A1 | 6/2010 | Cho et al. |
| 2010/0149773 | A1 | 6/2010 | Said |
| 2011/0169151 | A1 | 7/2011 | Camacho et al. |
| 2011/0201159 | A1 | 8/2011 | Mori et al. |
| 2012/0018866 | A1 | 1/2012 | Camacho et al. |
| 2012/0068318 | A1 | 3/2012 | Camacho et al. |
| 2012/0280377 | A1 | 11/2012 | Do et al. |

* cited by examiner

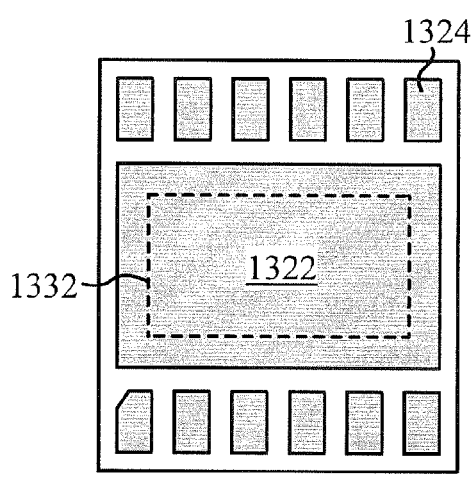
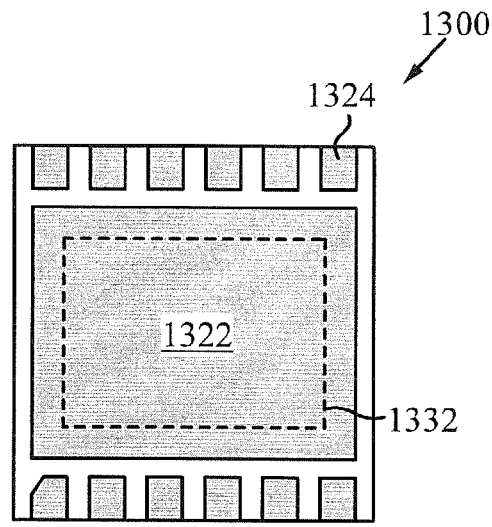
Fig. 13   Fig. 13A
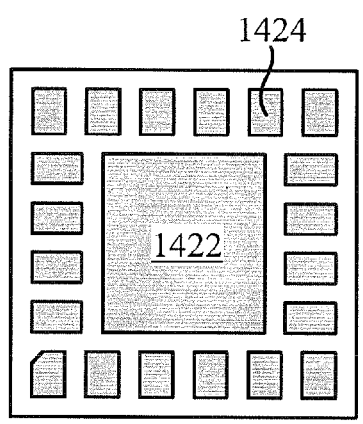
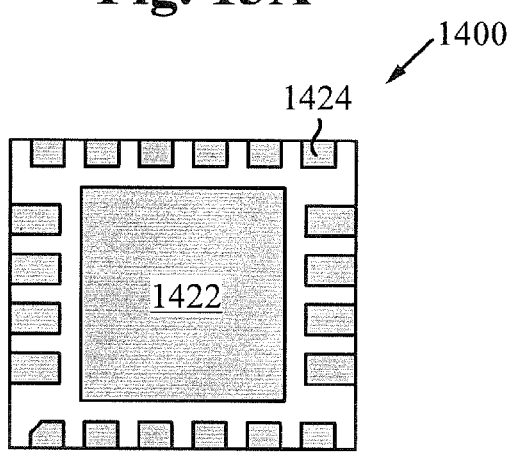
Fig. 14   Fig. 14A
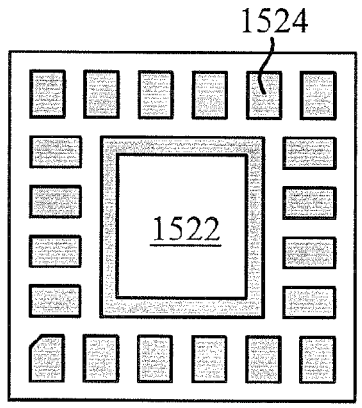
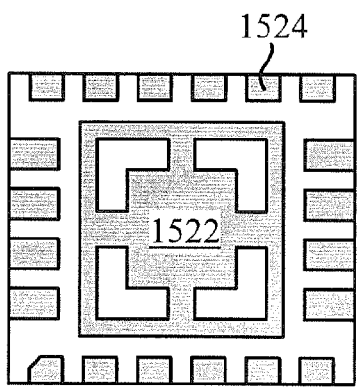
Fig. 15   Fig. 15A

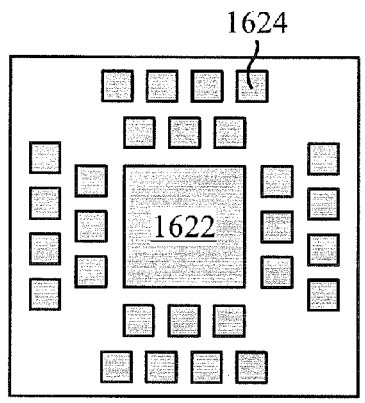
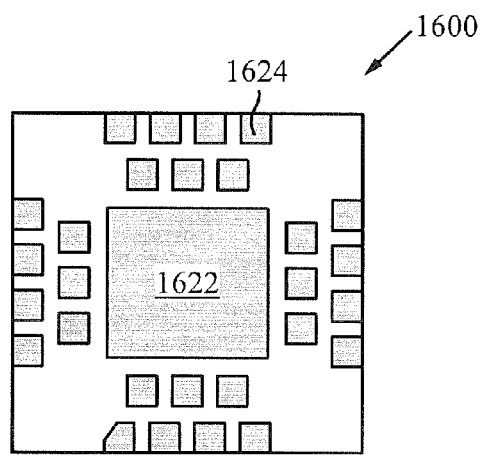
Fig. 16          Fig. 16A
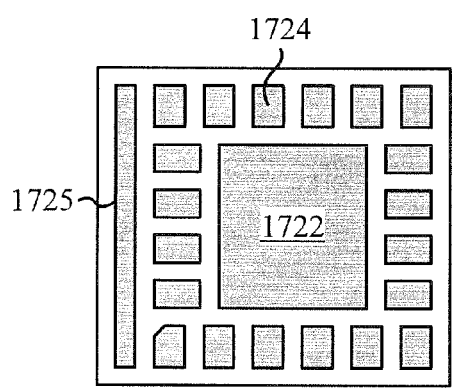
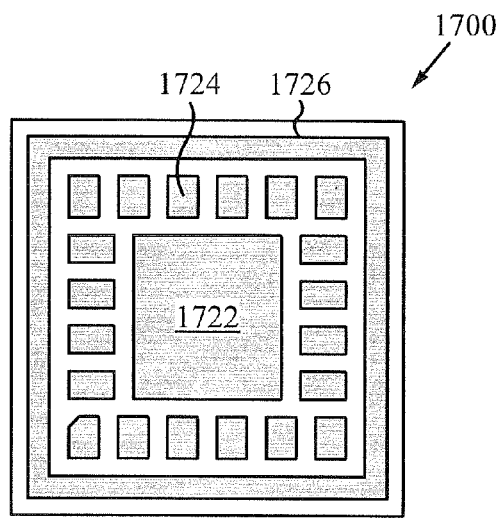
Fig. 17
Fig. 17A

LEAD FRAME LAND GRID ARRAY WITH ROUTING CONNECTOR TRACE UNDER UNIT

RELATED APPLICATIONS

This application is a Divisional of co-pending U.S. patent application Ser. No. 13/040,112, filed on Mar. 3, 2011, and entitled "LEAD FRAME LAND GRID ARRAY WITH ROUTING CONNECTOR TRACE UNDER UNIT," which is hereby incorporated by reference. The U.S. patent application Ser. No. 13/040,112, filed on Mar. 3, 2011, and entitled "LEAD FRAME LAND GRID ARRAY WITH ROUTING CONNECTOR TRACE UNDER UNIT" is a Continuation In Part and claims priority under 35 U.S.C. §120 of U.S. patent application Ser. No. 11/731,522, filed Mar. 30, 2007, entitled "LEAD FRAME LAND GRID ARRAY," which in turn claims benefit of priority under 35 U.S.C. section 119(e) of U.S. Provisional Patent Application 60/795,929, filed Apr. 28, 2006, all of which are incorporated herein by reference. The U.S. patent application Ser. No. 13/040,112, filed on Mar. 3, 2011, and entitled "LEAD FRAME LAND GRID ARRAY WITH ROUTING CONNECTOR TRACE UNDER UNIT" also claims priority under 35 U.S.C. section 119(e) of U.S. Provisional Patent Application 61/321,060, filed Apr. 5, 2010, which is incorporated herein by reference.

FIELD OF THE INVENTION

The present invention is related to the field of semiconductor packaging. More specifically, the present invention is directed to lead frame land grid array (LLGA).

BACKGROUND

The art of surface mount technologies for some semiconductor packages, is developing at a rapid pace. For instance, the following set of continuation-in-part and divisional patents describes one such developing lineage. In particular, U.S. Pat. No. 6,072,239 to Yoneda, et al., entitled "Device Having Resin Package with Projection" (Yoneda '239) claims, among other things, a device having a chip, a resin package sealing the chip, metallic films, and connecting parts. The resin package has resin projections that are located on a mount-side surface of the resin package. The resin projections have surfaces that are parallel to the mount-side surface of the resin package. The metallic films are formed on the entire surfaces of the resin projections.

U.S. Pat. No. 6,159,770 to Tetaka, et al., entitled "Method and Apparatus for Fabricating Semiconductor Device," (Tetaka '770) claims a method of fabricating the semiconductor device of Yoneda '239. Tetaka '770 is a continuation-in-part of Yoneda '239.

U.S. Pat. No. 6,329,711 to Kawahara, et al., entitled "Semiconductor Device and Mounting Structure," (Kawahara '711) claims a semiconductor device that has a semiconductor element, a resin package sealing the semiconductor element, resin projections, metallic film parts, connecting members, and connection pads. Each of the metallic film parts has a single point that makes contact with a circuit board. Kawahara '711 is a continuation-in-part of Yoneda '239.

U.S. Pat. No. 6,376,921 to Yoneda, et al., entitled "Semiconductor Device, Method for Fabricating the Semiconductor device, Leadframe and Method for Producing the Leadframe" (Yoneda '921) claims a semiconductor device that has a semiconductor element, a resin package sealing the semiconductor element, resin projections, metallic film portions, and connecting members. The resin projections protrude downward from a mounting surface of the resin package. Yoneda '921 is a continuation-in-part of Yoneda '239.

U.S. Pat. No. 6,573,121 to Yoneda, et al., entitled "Semiconductor Device, Method for Fabricating the Semiconductor Device, Leadframe and Method for Producing the Leadframe," (Yoneda '121) claims a method of producing a lead frame used to fabricate the semiconductor device of Yoneda '921. Yoneda '121 is a division of Yoneda '921.

However, this patent family lineage describes fabricating semiconductors by using numerous processing steps. Moreover, the packages produced by the patents mentioned above have certain limitations in the art.

Furthermore, current trends in integrated circuit packaging require a greater number of leads or solder bumps in a smaller and thinner form factor. To that end, the applicants have developed IC packaging technology relating to plating desired areas onto a metal substrate thereby forming several plated areas that serve as contacts, leads, die attach pads, or the like in Co Pending U.S. patent application Ser. No. 12/688,602. However, as IC developers produce ICs having a larger number of input/outputs (I/O), a greater number of contacts is required in the corresponding IC package. As the density of the contacts, or leads, are increased, what results is less robust IC packages. In some instances, the plated contacts or other structures peel away from the finished IC package. Such peeling is exacerbated by requirements of more thin packages that in turn require more thin plating.

SUMMARY OF THE DISCLOSURE

A carrier, or semiconductor package, for a semiconductor die is provided herein. The carrier generally comprises several contact traces that run underneath the die. The contact traces are plated onto a metal substrate, such as copper, and when the substrate is sacrificed, what are left are the contact traces. Advantageously, the traces can be made extremely thin. In combination with extremely thin semiconductor die backgrinding techniques well known in the semiconductor manufacturing industry, the semiconductor package and method for its manufacture described herein enables packages in the thickness of fractions of a millimeter. Furthermore, support structures for the contact traces are provided. The support structures serve to absorb heat during the process of mounting the package to an end application, absorbing stress applied to the contact, and generally provide structural support to the contact trace. The support structures can be formed in the same manufacturing steps as the contact traces. As one result, the support structures reduce occurrences of traces peeling away from the semiconductor package without adding significant cost or additional manufacturing steps.

In one aspect of the invention, a semiconductor package comprises a plurality of contact traces each having a first and second end, a first semiconductor die, and a resin encapsulant for encapsulating at least a portion of the plurality of contact traces and first semiconductor die, wherein the contact traces are arranged substantially underneath the semiconductor die. The first ends of the contact traces are coupled with wirebonds for forming electrical connections with the semiconductor die, and the second ends are used to form electrical connections with an end application, such as a printed circuit board. In some embodiments, the second ends of the contract traces each comprise a contact pad configured to receive a solder ball. Preferably, each contact pad comprises at least one support structure. The support structure can be of a variety of shapes, having arcuate or linear features, extend outward from the second end of the contact trace, or at least partially circumscribes or surrounds the second end of the contact trace. In some embodiments, The package further comprises a second semiconductor die coupled to the first semiconductor die, wherein the second semiconductor die is coupled to the wirebonding end of at least one contact trace by a bondwire. Alternatively, the second semiconductor die is coupled to the first semiconductor die by a solder bump.

In another aspect of the invention, a method of forming a semiconductor package comprises plating a plurality of contact traces on a metal substrate, each contact trace having a first end and a second end, mounting semiconductor die substantially above the second ends of the contact traces, removing the metal layer, thereby exposing the contact traces, and singulating individual semiconductor die. Preferably, the method further comprises forming at least one support structure about the second end of at least one contact trace. In some embodiments, the step of forming support structures comprises forming at least one plated area extending outward from the second end of the at least one contact trace. Alternatively, the step of forming support structures comprises forming at least one plated area at least partially circumscribing the second end of the at least one contact trace.

In another aspect of the invention, a semiconductor device comprises a semiconductor die having an active surface and an inert surface, a plurality of contact traces routed underneath the inert surface, wherein the contact traces comprise a plurality of plated layers, each contact trace having a first end and a second end, at least one bondwire for electrically coupling the first end of at least one contact trace to the active surface of the semiconductor die, a resin encapsulant encasing at least a portion of the semiconductor die and plurality of contact traces, and a plurality of support structures formed about the second ends of the plurality of contact traces. The support structures can be formed to extend outward from the contact traces, at least partially circumscribe the contact traces, or a combination of both.

BRIEF DESCRIPTION OF THE DRAWINGS

The novel features of the invention are set forth in the appended claims. However, for purpose of explanation, several embodiments of the invention are set forth in the following figures.

FIG. 4 illustrates a package having contact pads that are not at the edge of the package.

FIG. 5 illustrates a package having a die that is larger than its die attach pad.

FIG. 6 illustrates a die overhanging its die attach pad.

FIG. 7 illustrates a die having a size that is close to the size of a package.

FIG. 8 illustrates solder balls are optionally used to couple the die to the contact pads.

FIG. 9 illustrates a package that is a hybrid of flip chip and wire bonding methods.

FIGS. 10-12 illustrate a stacked die implementation.

In particular, FIG. 10 illustrates stacked die where one die is smaller than another die.

FIG. 11 illustrates stacked die that are approximately the same size with a spacer die.

FIG. 12 illustrates stacked die that are approximately the same size with epoxy instead of a spacer die.

FIGS. 13-17 illustrate various bottom view configurations for multiple embodiments of the invention.

In particular, FIG. 13 illustrates contact pads at the sides of a die pad, according to some embodiments.

FIG. 13A illustrates the package of FIG. 13 with the contact pads at the edge of the package.

FIG. 14 illustrates contact pads surrounding the periphery of the die pad.

FIG. 14A illustrates the package of FIG. 14 with the contact pads at the edge of the package.

FIG. 15 illustrates a die pad having an exposed center.

FIG. 15A illustrates an alternative configuration for the die pad and with contact pads at the edge of the package.

FIG. 16 illustrates multiple rows of contact pads surrounding the periphery of the die pad.

FIG. 16A illustrates the package of FIG. 15 with the outer most row of contact pads at the edge of the package.

FIG. 17 illustrates a guard band according to some embodiments.

FIG. 17A illustrates a guard ring in accordance with some embodiments of the invention.

DETAILED DESCRIPTION

In the following description, numerous details and alternatives are set forth for purpose of explanation. However, one of ordinary skill in the art having the benefit of this disclosure will realize that the invention can be practiced without the use of these specific details. In other instances, well-known structures and devices are shown in block diagram form in order not to obscure the description of the invention with unnecessary detail.

I. Method

Figure 1:
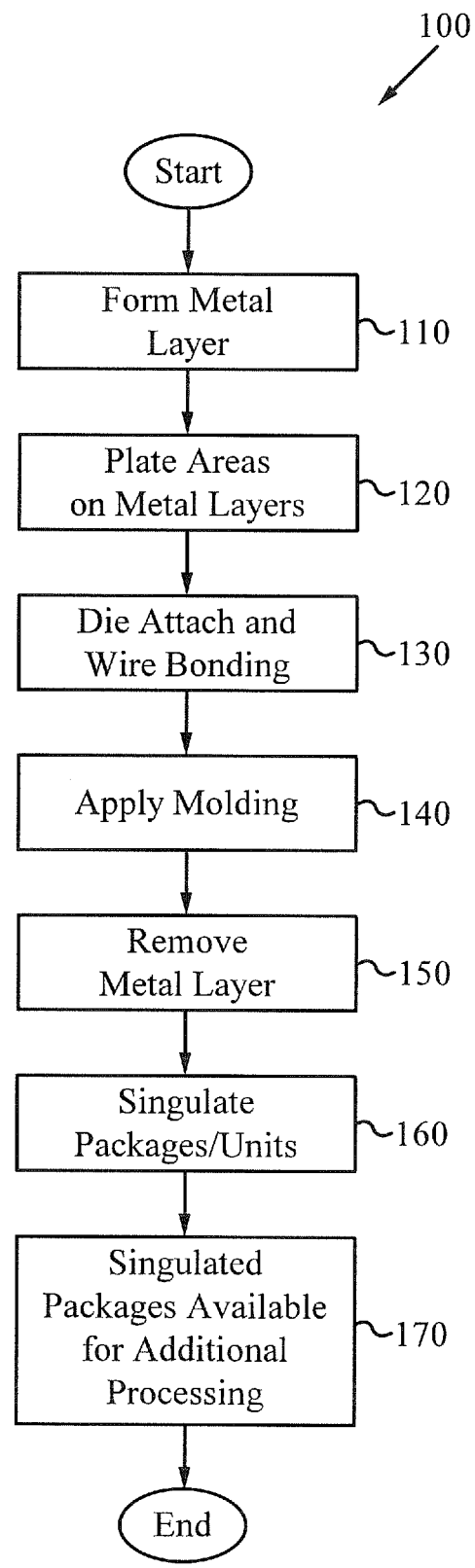
FIG. 1 illustrates a process according to some embodiments of the invention.
Figure 1A:
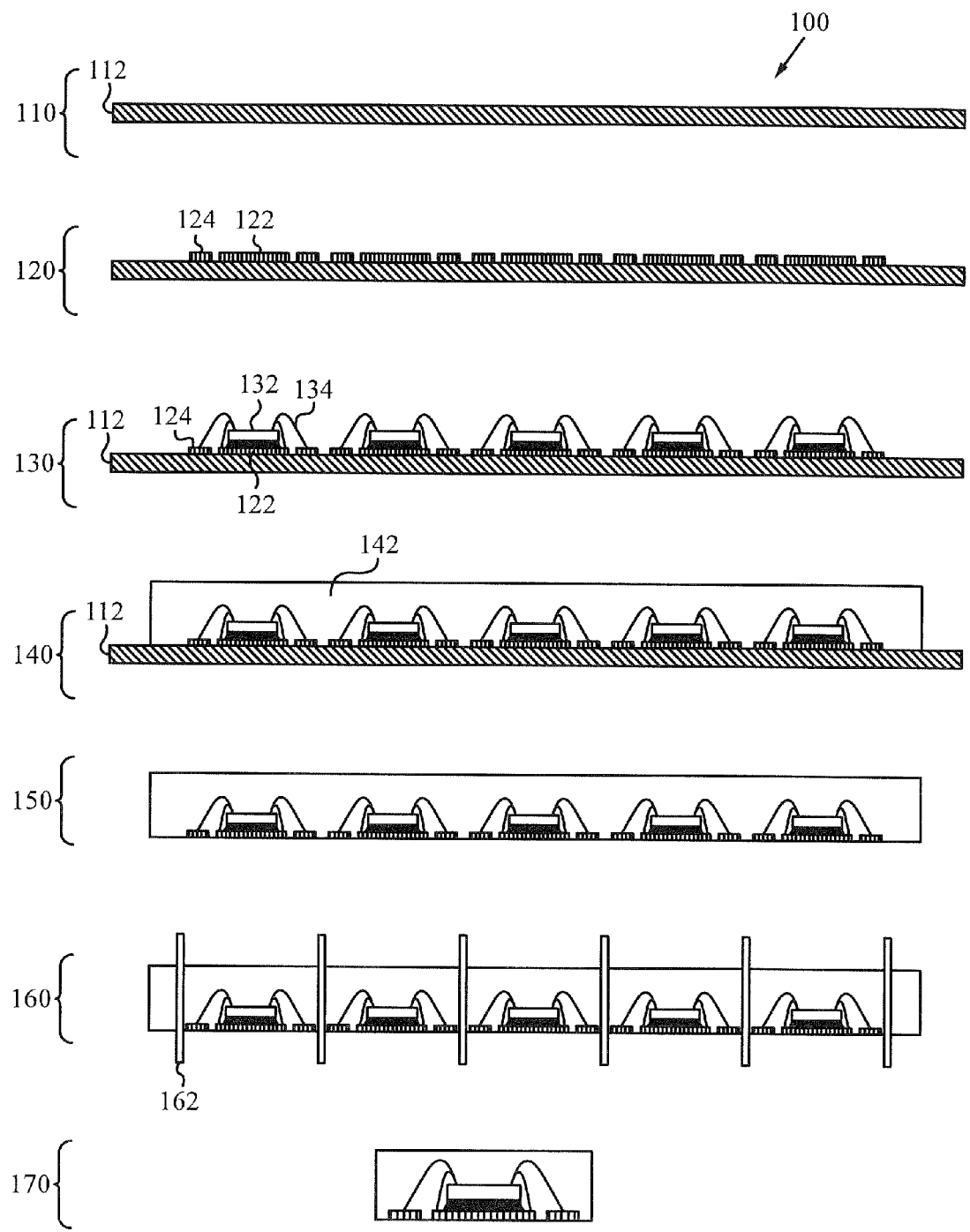
FIG. 1A illustrates an exemplary result for each step in the process of FIG. 1.

FIG. 1 illustrates a process 100 for manufacturing a semiconductor package according to some embodiments of the invention. FIG. 1A illustrates an exemplary result for each step in the process 100 of FIG. 1. As shown in these figures, the process 100 begins at the step 110, where a metal layer 112 is formed. The metal layer typically comprises copper, Alloy 42, or another suitable metal material, and has a typical thickness of about 0.1 to 0.15 millimeters. Then, after the step 110, the process 100 transitions to the step 120, where particular areas on the metal layer 112 are plated. These areas typically include an area for a die pad 122 and a contact pad 124.

Once the particular areas on the metal layer 112 are plated, the process 100 transitions to the step 130, where die attach and/or wire bonding occur. As shown in FIG. 1A, die attach typically includes coupling a die 132 to the die attach pad 122, while wire bonding includes using a wire 134 to couple the die 132 to the die pad 122 and/or one or more contact pads 124.

After die attach and/or wire bonding occur at the step 130, the process 100 transitions to the step 140, where a molding 142 is applied. Typically the molding 142 includes a plastic polymer or resin that encapsulates the die 132, the wire bonds 134, the top surface of the metal layer 112, and the top surface of the plated areas, including the die pad 122 and the contact pads 124.

Once the molding 142 is applied at the step 140, the process 100 transitions to the step 150, where the metal layer 112 is removed. Some embodiments employ a chemical etchant to etch away the metal layer 112 without affecting the plated areas (122 and 124) or the molding 142. In these embodiments, when the metal layer 112 is etched away, the bottom surfaces of the plated areas, including the die pad 122, and the contact pads 124, are typically exposed.

At this point, some embodiments have formed a molded block 300 (see FIG. 3) having exposed plated contact areas. Such a configuration has particular advantages in the industry. For instance, the molded block 300 is advantageously employed for testing and other processes after the step 150 of FIG. 1. The testing of some embodiments comprises a parallel, high speed, and/or bulk process for several of the devices located within the molded block 300. The molded block 300 of these embodiments is further described below in relation to FIG. 3.

Figure 2:
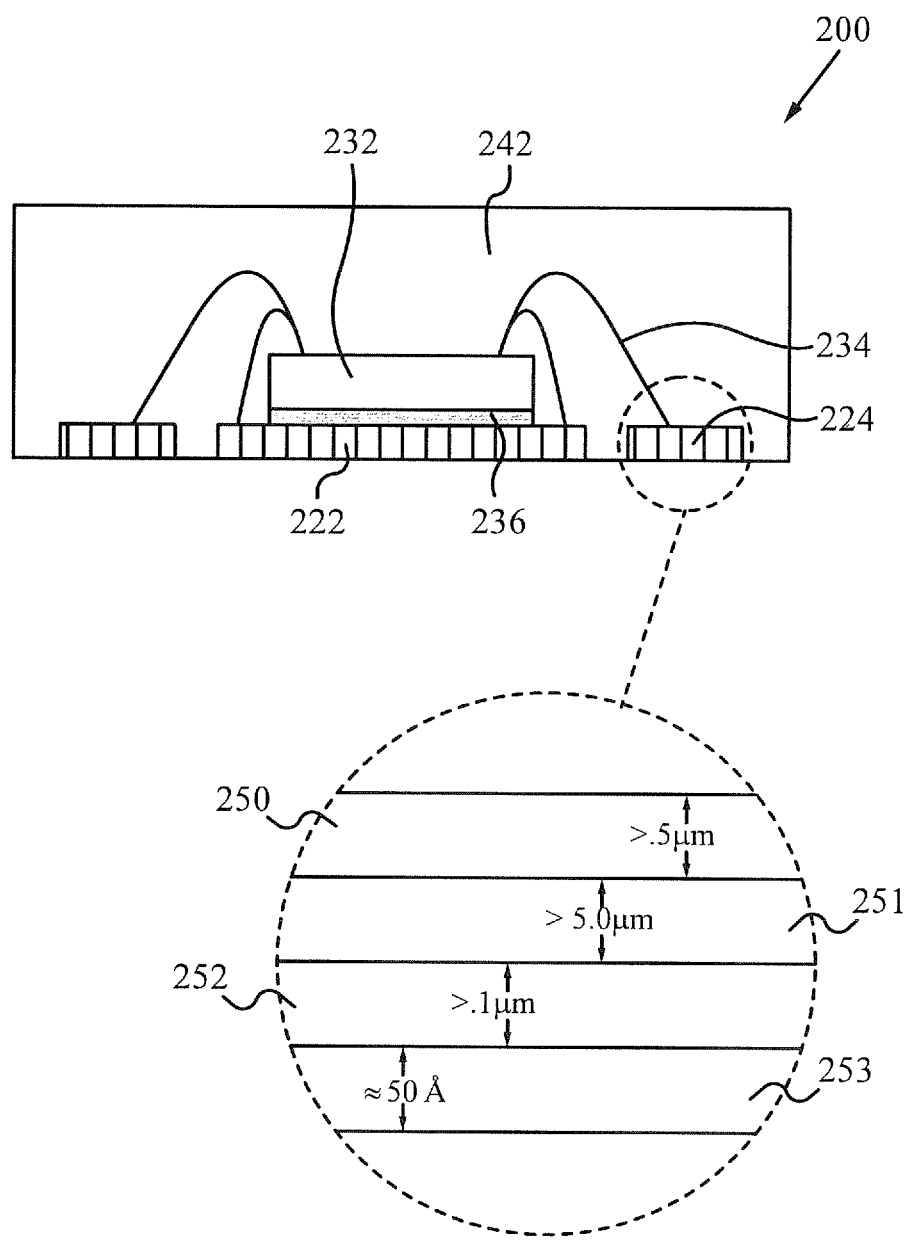
FIG. 2 illustrates an exemplary product of the method of some embodiments in further detail.

Regardless of any testing and/or additional process steps after the step 150 of FIG. 1, the process 100 typically transitions to the step 160, where individual units contained within the molded block 300 are singulated to form individual semiconductor packages (see FIG. 2). Then, the process 100 transitions to the step 170, where the singulated packages are available for additional testing, processing, shipping and/or use. However, testing, handling, and/or processing of individual singulated packages at the step 170, rather than by using the molded block 300 (available after the step 150), presents certain disadvantages, as discussed below. After the step 170, the process 100 concludes.

FIG. 2 illustrates an exemplary package 200 of the method of some embodiments in further detail. As shown in this figure, the exemplary package 200 has an exposed die attach pad 222, one or more contact pads 224, a semiconductor die 232, one or more wire bonds 234, an adhesive 236, and a molding compound 242. The adhesive 236 preferably couples the die 232 to the die attach pad 222. The wire bonds 234 typically couple the die 232 to one or more contact pads 224 and/or the die attach pad 222.

Also shown in FIG. 2, the plating of some embodiments comprises multiple layers. For instance, the plating layers of some embodiments include palladium, nickel, and/or gold. In a particular embodiment, a first layer of palladium 250 has a minimum thickness of 0.5 micro meters, a layer of nickel 251 has a minimum thickness of 5.0 micro meters, a second layer of palladium 252 has a minimum thickness of 0.1 micro meters, and a layer of gold 253 has a thickness of about 50 Angstroms. In some of these particular embodiments, the first layer of palladium is located near an interior of the package for providing a coupling locus to the wire bond 234, while the gold plating is preferably located near, or is exposed near the bottom surface of the package 200, for providing a contact locus to a printed circuit board, or the like. The plated area (the die pad and contact pads) of these embodiments typically has a total thickness in the range of about 6.0 micro meters to 12.0 micro meters. As mentioned above, the plated area(s) and the molding are minimally or not affected by the removal of the metal layer at the step 150 of FIG. 1. For instance, when the metal layer comprises copper, and the removal step 150 involves using a chemical etchant, preferably, the etchant and/or the plating structure are selected such that the etchant is reactive (removes) the metal layer with minimal effect to the plating. An example of such an etchant includes cupric chloride.

Figure 3:
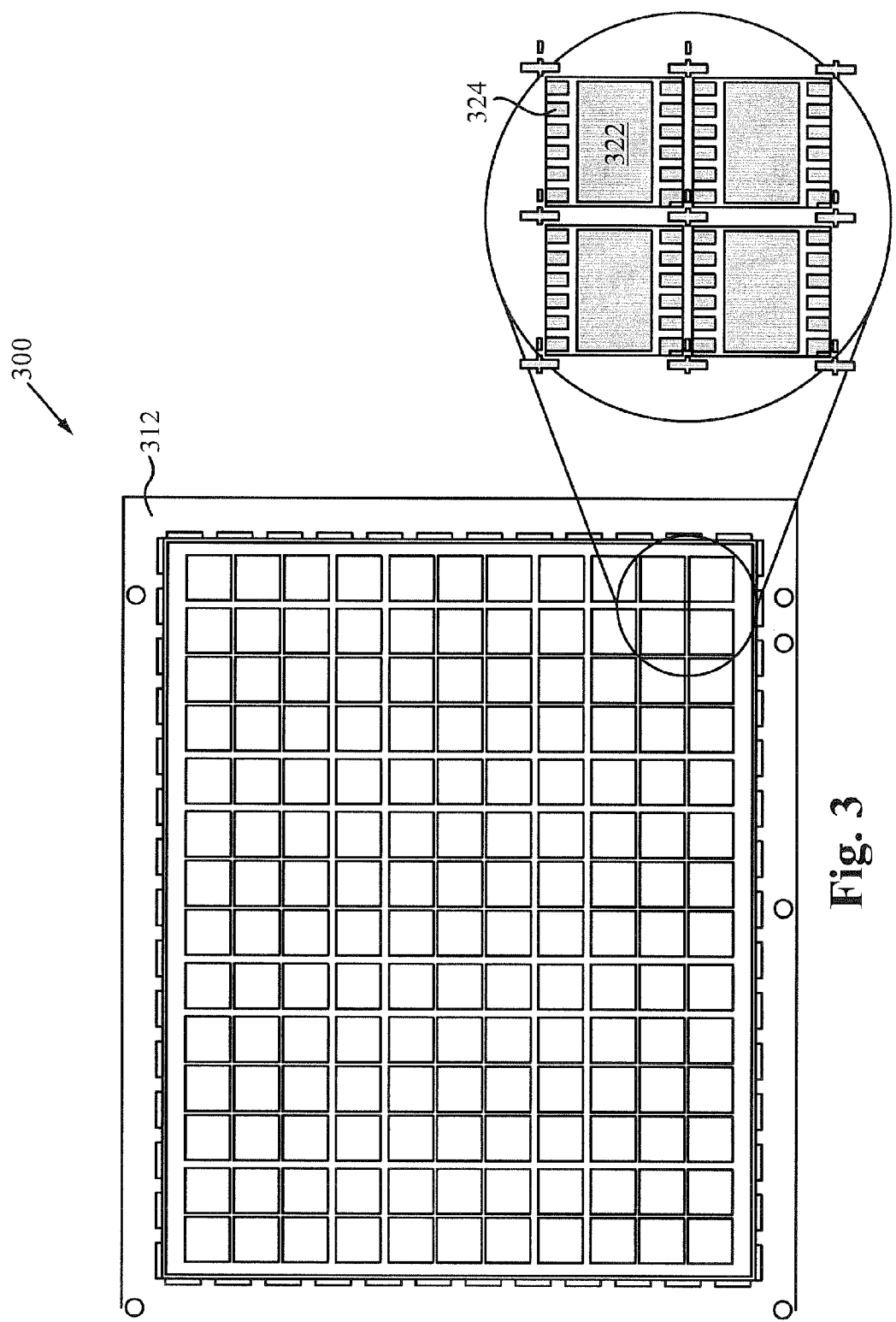
FIG. 3 illustrates a molded block in accordance with some embodiments.

Also mentioned above, the molded blocks produced during the process 100 have certain advantages for handling and additional processing, over the individual singulated packages illustrated in FIG. 2. FIG. 3 illustrates a molded block 300 in accordance with some embodiments. As shown in this figure, the molded block 300 includes plated areas (that typically include die pads 322 and/or contact pads 324) for attaching potentially many semiconductor devices. Also shown in FIG. 3, the molded block 300 has an attached metal layer 312 that was used for the plating and molding (encapsulation) steps to generate the molded block 300. As mentioned above, the metal layer 312 is preferably etched away to expose the plated areas of the molded block 300.

The molded block 300 of these embodiments has certain advantages, particularly for the manipulation and testing of semiconductor devices. For instance, the molded block of a particular embodiment has dimensions of approximately 1.77×2.0 inches, and includes approximately 250 to 2,500 semiconductor units. This molded block, due to its molding strength and particular size, is configured for parallel processing of substantially all of the semiconductor devices within the molded block, simultaneously. Conventionally, semiconductor device and/or package processing includes time consuming operations, such as test, for example. However, parallel processing of such operations advantageously enhances the speed and reliability of performing such operations, for bulk quantities.

II. Streamlined Process and Configuration Advantages

The process 100 described above, further includes additional advantages. For instance, due to the direct use of the metal layer and plated areas, and the subsequent removal of the metal layer to expose the plated areas, embodiments of the invention reduce the number of process steps required for semiconductor package formation. This presents cost savings, and time savings, which present additional cost savings, over conventional methods. These and other advantages are discussed in further detail below, in relation to the referenced figures.

FIGS. 4-17 illustrate various side and/or bottom view configurations for multiple embodiments of the invention. Some of these embodiments are formed by using the process 100 described above in relation to FIGS. 1 and 1A. As illustrated in FIGS. 4-17, these packages have several advantages.

(1) For instance, as mentioned above, the process 100 has fewer steps of fabrication than conventional methods known in the art. Because the process 100 has fewer steps, it is less expensive than the processes known in the art. Moreover, because the process 100 has fewer steps, it is also generally faster than other processes, or, in other words, has a higher throughput.

(2) The process 100 is capable of yielding package sizes that are close to the dimension of the packaged die inside the package. The advantages of reductions in package size are understood by those of ordinary skill. For example, a package having a footprint that is approximately its die size will require a mounting area on a circuit board that is not much greater than approximately the size of the die. Thus, this advantage allows the placement of many more semiconductor devices on a board, or the use of a smaller circuit board, which further typically results in smaller form factor applications, and additional size and/or cost savings, such as from reduced shipping and manufacturing costs, for example.

(3) Further, a package having a thickness close to the die thickness encapsulated inside the package allows for lower profile implementations that use such small outline and/or low profile packages.

(4) Because the critical factor regarding height for the packages formed by the process 100, is typically the height of the die, or another factor, the height of the contact pads has no or negligible impact on the height of the package. Effectively, the contact pads have a zero, or almost zero, height in relation to the height of the package and/or the die.

(5) Additionally, because the process 100 has fewer steps, and its products are typically close in size to the small encapsulated die, the packages illustrated and described herein provide savings in the volume of construction materials consumed over time, or, in other words, provide a higher yield. Moreover, the various many possible package configurations enabled by the process 100 described above, yield further advantages, as discussed below.

III. Side ("Cross Section") Views of Exemplary Package Designs

Figure 4:
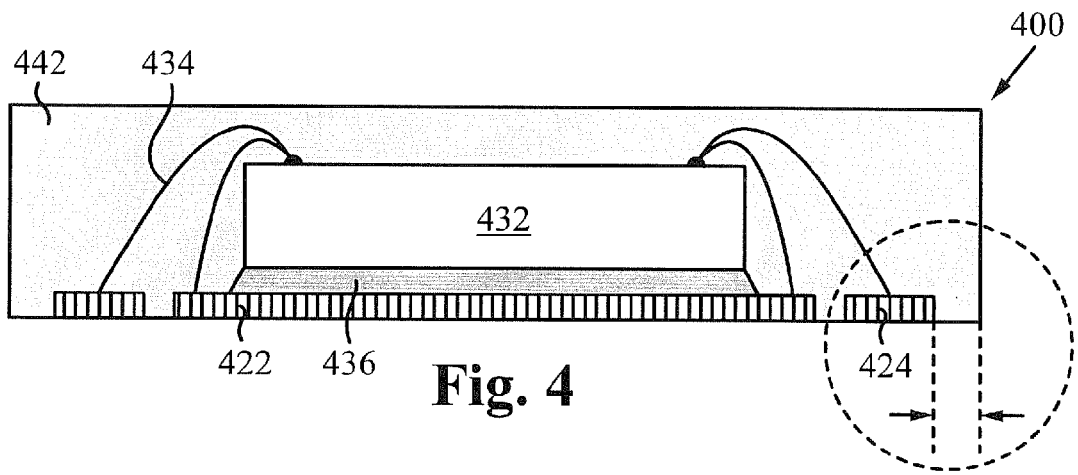
FIGS. 4-12 illustrate cross section views taken on a side of a package in accordance with some embodiments.
Figure 4A:
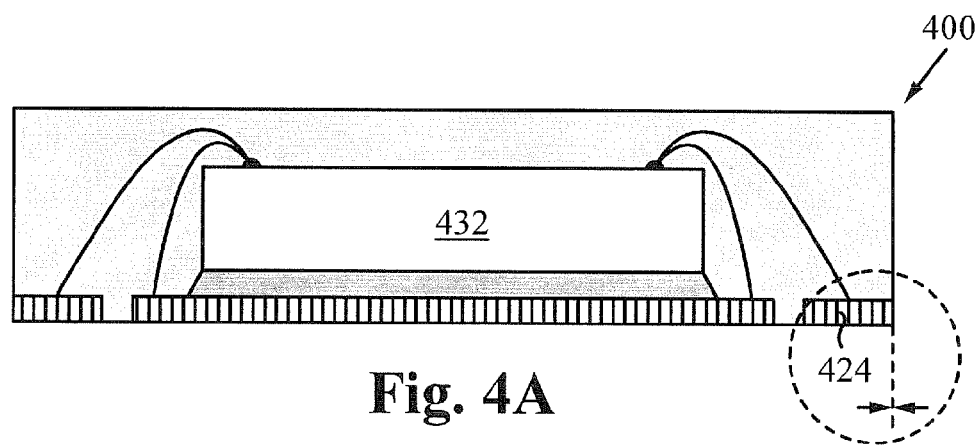
FIG. 4A illustrates a package having contact pads that are at the edge of the package.

FIGS. 4-12 illustrate a cross section (side view) of the package of some embodiments. For instance, FIG. 4 illustrates a package 400 having contact pads 424 that are not at the edge of the package 400, while FIG. 4A illustrates a package having contact pads 424 that are at the edge of the package 400. Some embodiments alternatively select whether the contact pads 424 should be placed at the edge of the package 400. Some embodiments of the process 100 illustrated in FIGS. 1 and 1A above, account for the position of the contact pads 424 at the step 120 (plating) and/or the step 150 (singulation). As an example, some embodiments plate areas for the contact pads of two adjacent packages close together during the plating step 120 of FIG. 1. Then, during the singulation step 150 of FIG. 1, these embodiments singulate or remove the entire molding and unplated regions between the two contact pads, such that the resultant two separate packages to the left and right of the singulation cut have contact pads that are at the edge of the package. These packages are typically smaller in size and have a slightly smaller footprint due to the maximum use of the edge of the package for the contact pad. Hence, and as additionally shown in FIGS. 4 and 4A, the decision whether the contact pads 424 are placed at edge of the package 400, or not, affects the overall footprint and space available within and at the bottom footprint of the package 400.

Figure 5:
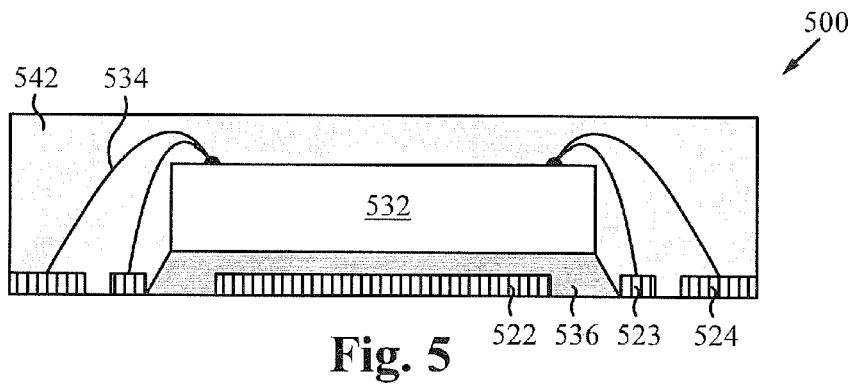
Figure 5A:
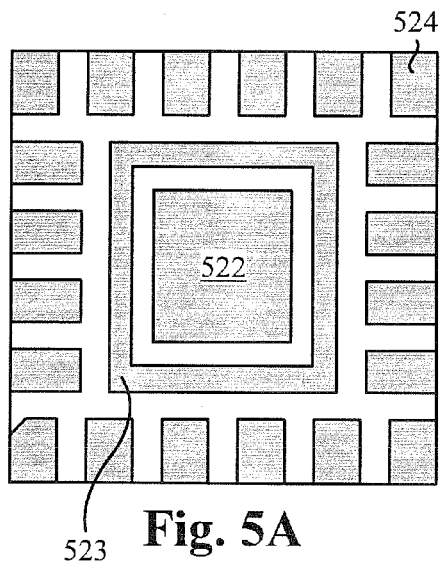
FIG. 5A illustrates a bottom view for the package of FIG. 5 having a ring around the die attach pad.
Figure 5B:
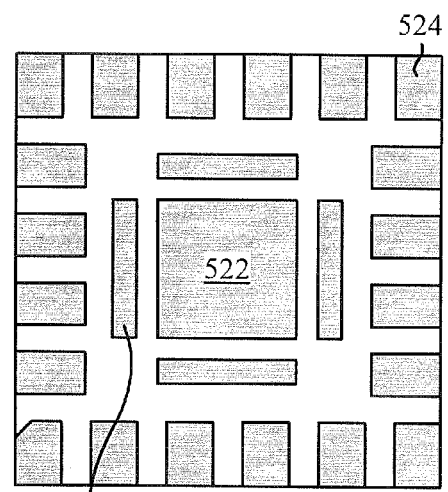
FIG. 5B illustrates an alternate bottom view for the package of FIG. 5, which has a discontinuous ring around the die attach pad.

Some embodiments have various additional configurations for the contact pads and the die pad that vary, in some aspects, in relation to the die. For instance, FIG. 5 illustrates a package 500 having a die 532 that is larger than its die attach pad 522. As shown in this figure, the die 532 of some of these configurations overhangs the die pad 522. In these configurations, an adhesive 536 typically used to secure the die 532 to the die pad 522, often spans the surface of the die pad 522 and spills over to engulf the surfaces of the die pad 522 that are not shielded by the metal layer during the encapsulation step (140 of FIG. 1). Due to the additional space between the die pad 522 and the edge-located contact pads 524, some of these configurations further include an additional plated ring around the die pad 522. Some of these rings are continuous, while some are discontinuous around the die pad 522. FIG. 5A illustrates a bottom view for the package 500 of FIG. 5 having a ring 523 around the die pad 522. FIG. 5B illustrates an alternate bottom view for the package 500 of FIG. 5, which has a discontinuous ring 523 around the die attach pad 522.

These plated areas 523 between the die pad 522 and the contact pads 524 provide additional plated areas for electrical contact and/or heat transfer for the package 500. Some embodiments, for instance, couple the die to the plated ring, particularly where the die overhangs the die pad, while some embodiments forego the die pad altogether in favor of the plated ring of these embodiments. More specifically, the purpose of the plated ring of particular embodiments is that some die designs, such as the "ground bond" design, require a connection between a top surface of the die, and a ground of the printed circuit board. In these embodiments, the plated ring 523 provides the grounding point for the printed circuit board. Some designs require a connection between a top surface of the die, and both the plated ring area 523 and a contact pad 524. These designs, often referred to as "down bond" designs, typically include a wire bond between the plated ring 523, and the contact pad 524 (not shown).

Figure 6:
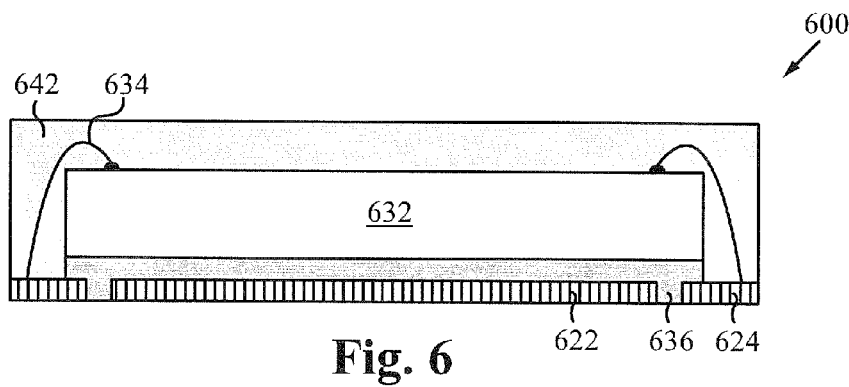

In additional embodiments, when the die overhangs the die pad, the die is attached to the die pad and is also advantageously attached to a portion of one or more contact pads. FIG. 6 illustrates such an embodiment where a die 632 that overhangs its die pad 622 is further attached to one or more contact pads 624. As shown in this figure, an adhesive 636 attaches the die 632 to both the die pad 622 and to the portions of the contact pads 624 that underlie the overhanging sides of the die 632.

Figure 7:
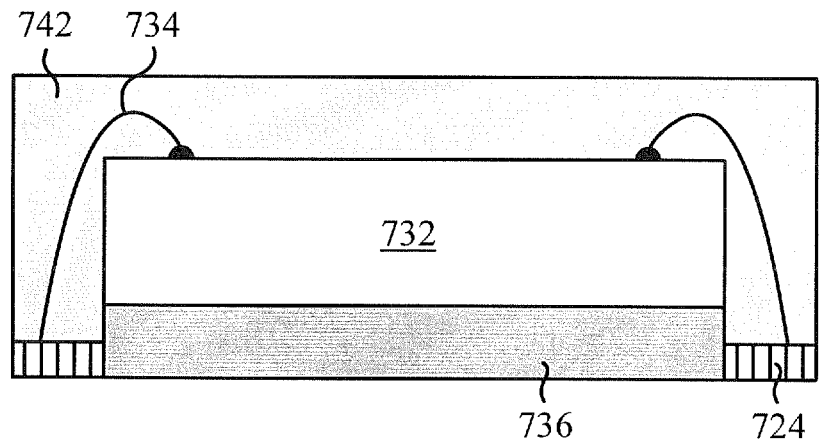

In some of the embodiments described above, or in other embodiments, the dimensions of the die approaches the size of the package. In other words, for very small packages, or for large die in relation to the size of the package, it is advantageous to optionally omit the die pad altogether. FIG. 7 illustrates such a package 700 that includes a die 732 having a size that is close to the size of the package 700. As shown in this figure, the die pad is omitted, such as during the plating step 120 of FIGS. 1 and 1A, above. In these embodiments, the omission of the die pad advantageously contributes to a reduction in form factor for the package 700.

Figure 7A:
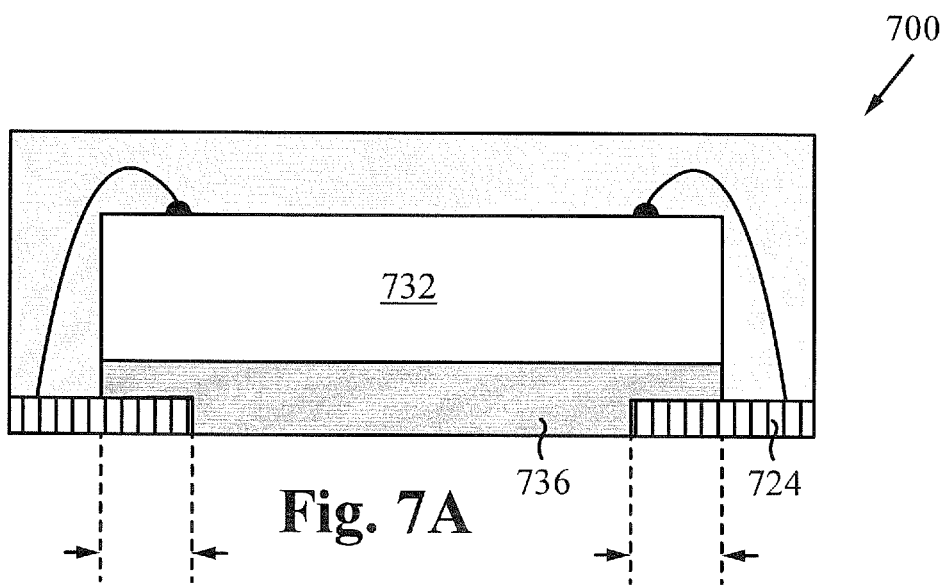
FIG. 7A illustrates a die similar in size to its package such that the die overhangs its die pad and the overhanging portion is bonded to the contact pads.

However, in some embodiments, it is often still desirable to provide external contact to the die pad, such as for electrical contact and/or heat dissipation, for example. FIG. 7A illustrates a die 732 having a similar size to a package 700, where the die 732 extends over the contact pads 724 and is bonded to the contact pads 724 by the adhesive 736.

Figure 8:
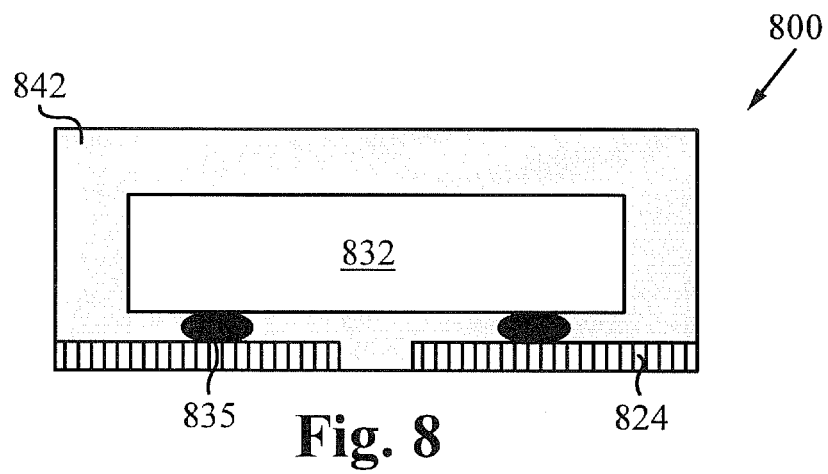

FIG. 8 illustrates that not only bond wires, but also solder balls 835 are (alternatively) applied for electrical connection between the die 832 and the contact pads 824 of alternative embodiments. This is also sometimes known as a flip chip style package.

Figure 9:
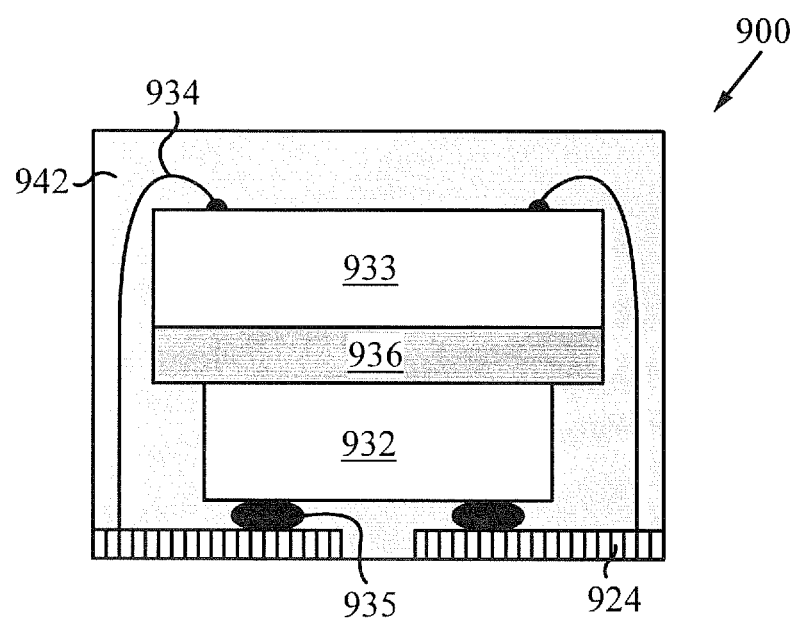

FIG. 9 illustrates that some embodiments have multiple dice 932 and 933, which are stacked by using a hybrid of flip chip and wire bond techniques. Accordingly, the die 932 is coupled to the contact pads 924 by using solder balls 935 in the flip chip style, while the die 933 is coupled to the contact pads 924 by using bond wires 934. Further, the die 932 is coupled to the die 933 by using an adhesive 936.

Stacked Die

Figure 10:
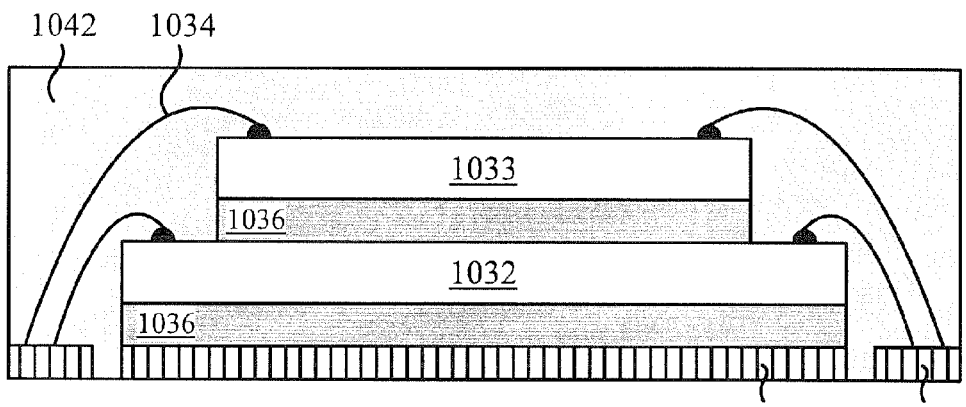
Figure 11:
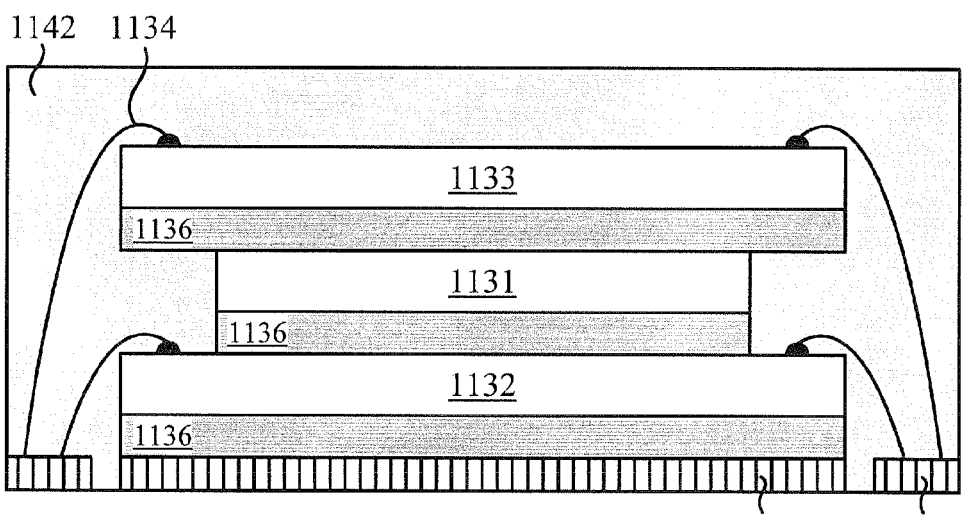
Figure 12:
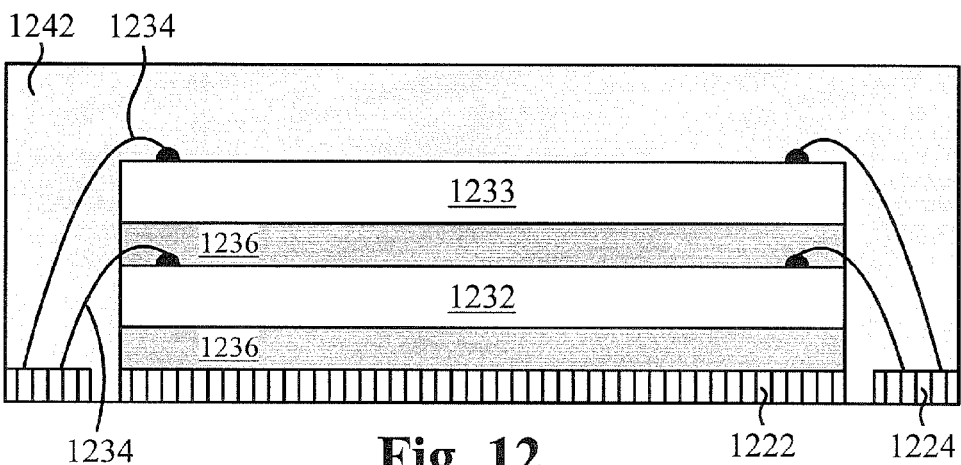

The packages of the embodiments described above further allow for a "stacked die" package configuration. Multiple and/or stacked die significantly increase the number of alternative configurations. FIGS. 10-12 illustrate some exemplary stacked die implementations in accordance with embodiments of the invention.

More specifically, FIG. 10 illustrates a daughter die 1033 that has a smaller size than a mother die 1032. As shown in this figure, the die 1033 is attached to the die 1032, which is attached to a die pad 1022. Typically, the attachment is by an adhesive 1036, while bonding wires 1034 couple the dice 1032 and 1033 to one or more contact pads 1024.

FIG. 11 illustrates a case where the daughter die 1133 and the mother die 1132 have the same approximate size. In these embodiments, a spacer die 1131 is advantageously inserted between the two stacked dice 1132 and 1133. As shown in the figure, the spacer die 1131 permits access to the die 1132 such that bond wires 1134 couple the die 1132 to the contact pads 1124.

FIG. 12 illustrates another option when the daughter die 1233 and the mother die 1232 have the same approximate size. In this configuration, an adhesive 1236 is applied directly between the two dice 1232 and 1233, instead of a spacer die. The adhesive 1236 of these embodiments includes an epoxy such as that used for die attach to a die pad, or another thermal, electrical, and/or adhesive material. As shown in FIG. 12, the adhesive advantageously permits access to the die 1232, such as by the bond wire 1234, for example.

IV. Bottom ("Floor Plan") Views

FIGS. 13-17 illustrate bottom views of the connector and/or mounting side of some of the packages described above.

More specifically, FIG. 13 illustrates a package 1300 that has contact pads 1324 at the sides of a die pad 1322. In this type of package 1300, the heat which is generated by the encapsulated semiconductor device (1332) during operation of the device (1332), is preferably transferred to the PCB via the die pad 1322. FIG. 13A illustrates the package 1300 of FIG. 13, with the contact pads 1324 at the edge of the package 1300.

FIG. 14 illustrates a package 1400 that has contact pads 1424 at the periphery of the die pad 1422. Moreover, these contact pads 1424 surround the die pad 1422 for achieving the benefit of higher pin counts in the small area of the package 1400. In FIG. 14, the contact pads 1424 are not at the edge of the package 1400, while in FIG. 14A, the contact pads 1424 are at the edge of the package 1400.

FIGS. 15 and 15A illustrate an alternative configuration for the die pad of FIG. 14. In FIG. 15, the die pad 1522 comprises a plated ring with an exposed center, while in FIG. 15A the die pad 1522 comprises a plated ring with a central plated portion attached to the ring with four connecting bars.

FIG. 16 also illustrates contact pads 1624 at the periphery of the die pad 1622, but in more than one perimeter or circumference around the die pad 1622. This implementation typically yields even higher pin counts for the small package 1600.

FIG. 17 illustrates contact pads 1724 at a periphery of the die pad 1722 with a security guard band 1725. As shown in this figure, some embodiments have only one guard band 1725. However, the package 1700 of other embodiments employ more than one guard band 1725. In fact, the guard band of some embodiments fully surrounds the die pad 1722, as a guard ring. FIG. 17A illustrates such an embodiment having contact pads 1724 at a periphery of the die pad 1722 with a security guard ring 1726.

The guard band 1725 and/or guard ring 1726 of these embodiments take advantage of and/or enable reduced contact pad height. As mentioned above, the contact pad height of some embodiments is zero, or almost zero. Some applications in the security field require an "unable" to test signal from the bottom of the package after installing the package on a PCB. The security guard band and/or ring is an additional (double) security measure that protects against having an open space, and/or separation of the package from the PCB during the insertion of a test signal probe between the (bottom of the) package and the PCB upon which the package is typically (surface) mounted. More specifically, the additional plated and/or metal soldering area for securing the package to the PCB, protects the contact pads and/or die pad of the package from undesirably separating from the PCB during handling, test, or another similar type of operation.

V. Plated Ball Grid Array

Figure 18:
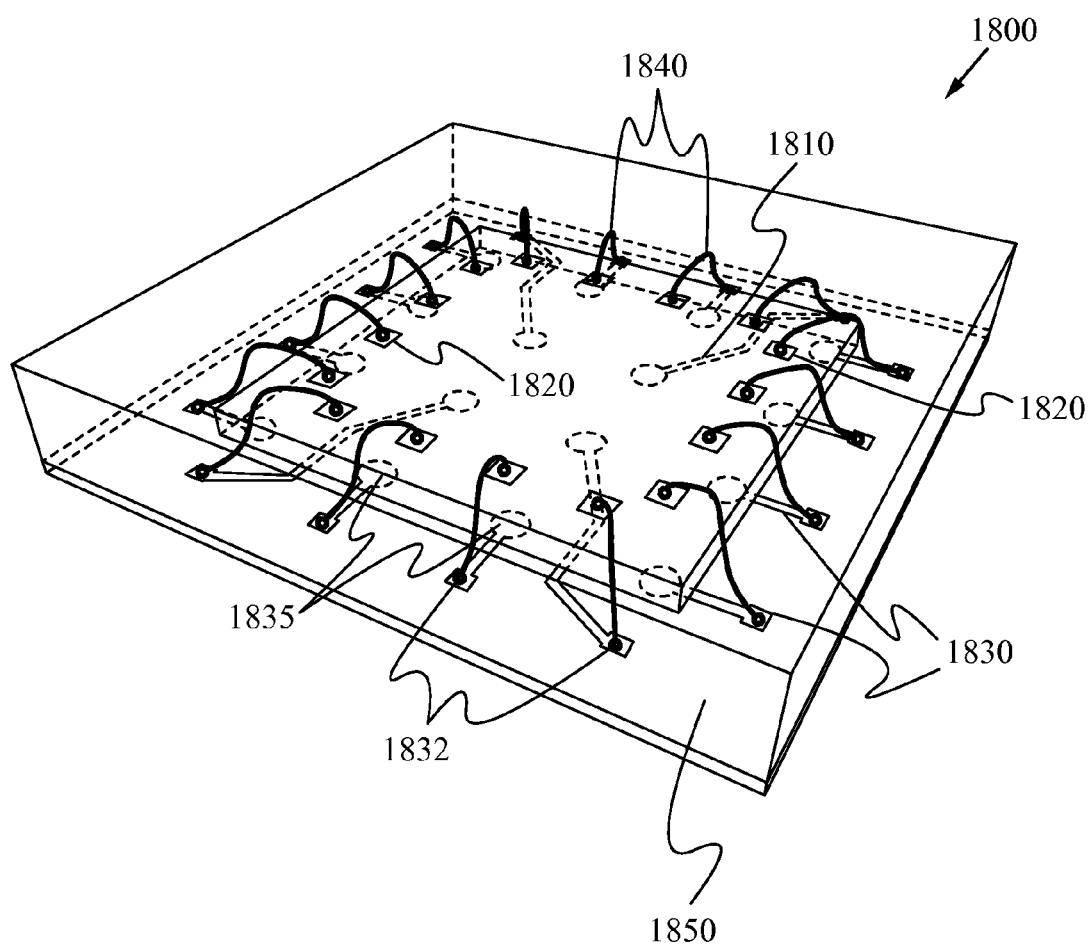
FIG. 18 illustrates a semiconductor package in phantom view per an embodiment of this invention.

FIG. 18 shows a plated ball grid array package 1800 in phantom view. The package 1800 comprises a semiconductor die 1810 having an active surface facing up toward the viewer and an inactive surface facing down. The active surface has several wirebonding pads 1820. These wirebonding pads 1820 serve as input/outputs for the semiconductor die 1810, for example providing power, control, inputs signals, desired outputs, and the like. The package 1800 further comprises a plurality of contact traces 1830. The contact traces 1830 each have a first end 1832 and a second end 1835. A bondwire 1840 is mounted to at least some of the first ends 1832 and to the wirebonding pads 1820 for forming an electrical connection between the die and the contact traces 1830 as desired. The second ends 1835 are configured with solder balls or solder bumps as explained below to form an electrical contact with an end application, usually a printed circuit board. The contact traces 1830 are arranged substantially underneath the semiconductor die 1810. This arrangement allows for the overall package 1800 to be only slightly larger than the semiconductor die 1810 itself. Furthermore, the contact traces 1830 are formed by plating methods described above. Also, the semiconductor die 1810 can be made extremely thin by die grinding techniques (sometimes known as backgrinding) that are able to produce semiconductor die that are fractions of millimeters thick. As a result, what is achieved is a highly thin, very small semiconductor package 1800.

Figure 19A:
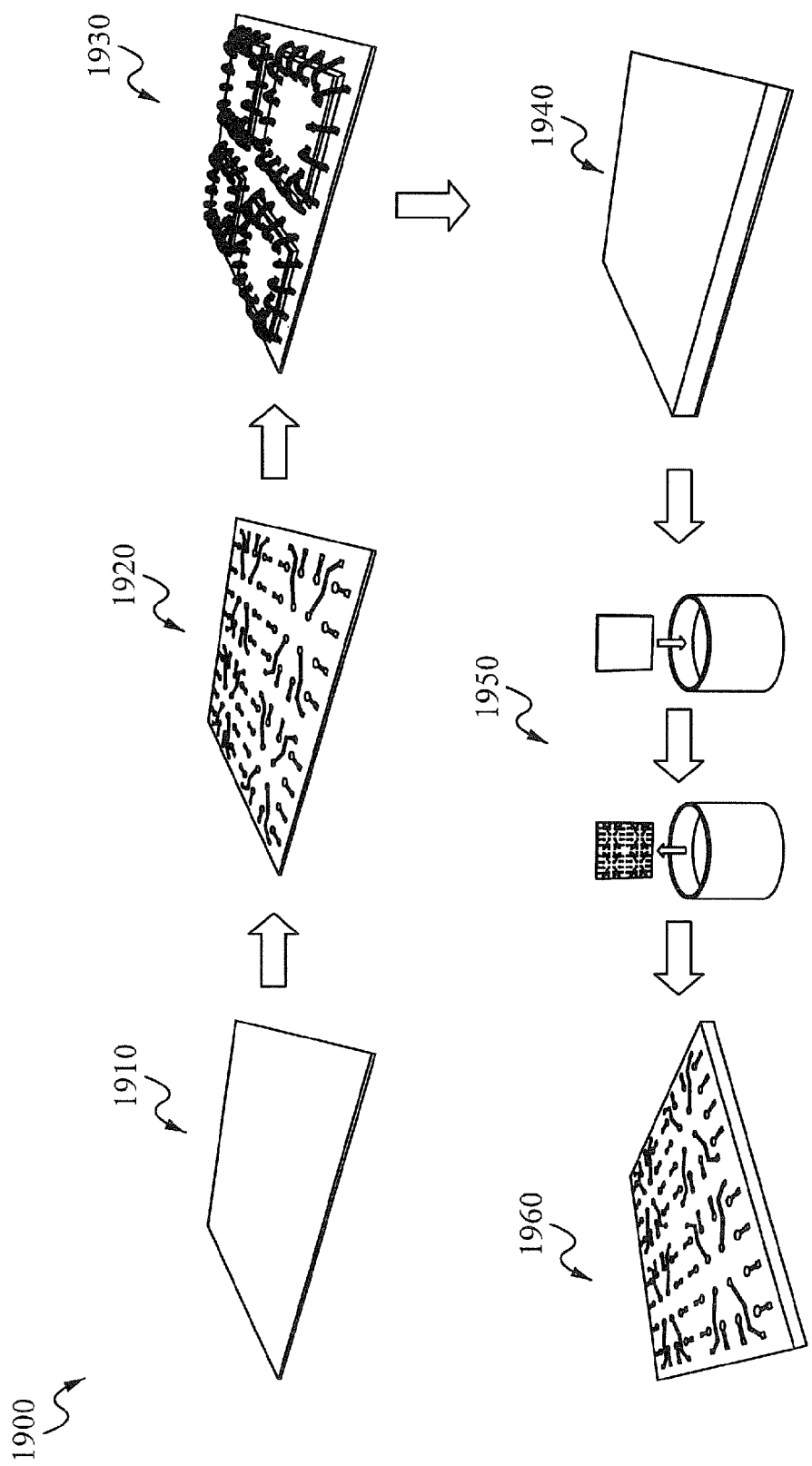
FIG. 19A illustrates a portion of a process for making the semiconductor package per an embodiment of this invention.

FIG. 19A shows some steps of a the process 1900 for forming the semiconductor package 1800 of FIG. 18. In a first step 1910, a metal substrate, preferably copper, is provided. In a later step 1920, a desired pattern of traces is plated upon the metal substrate. In a later step 1930, semiconductor die are mounted on the metal substrate above the traces and wirebonds are mounted to form electrical contacts as described above in FIG. 18. In a later step 1940, the substrate, semiconductor die, wirebonds, and contact traces are encased in a mold compound. In a step 1950, the metal substrate is sacrificed, leaving the contact traces visible in the later step 1960.

Figure 19B:
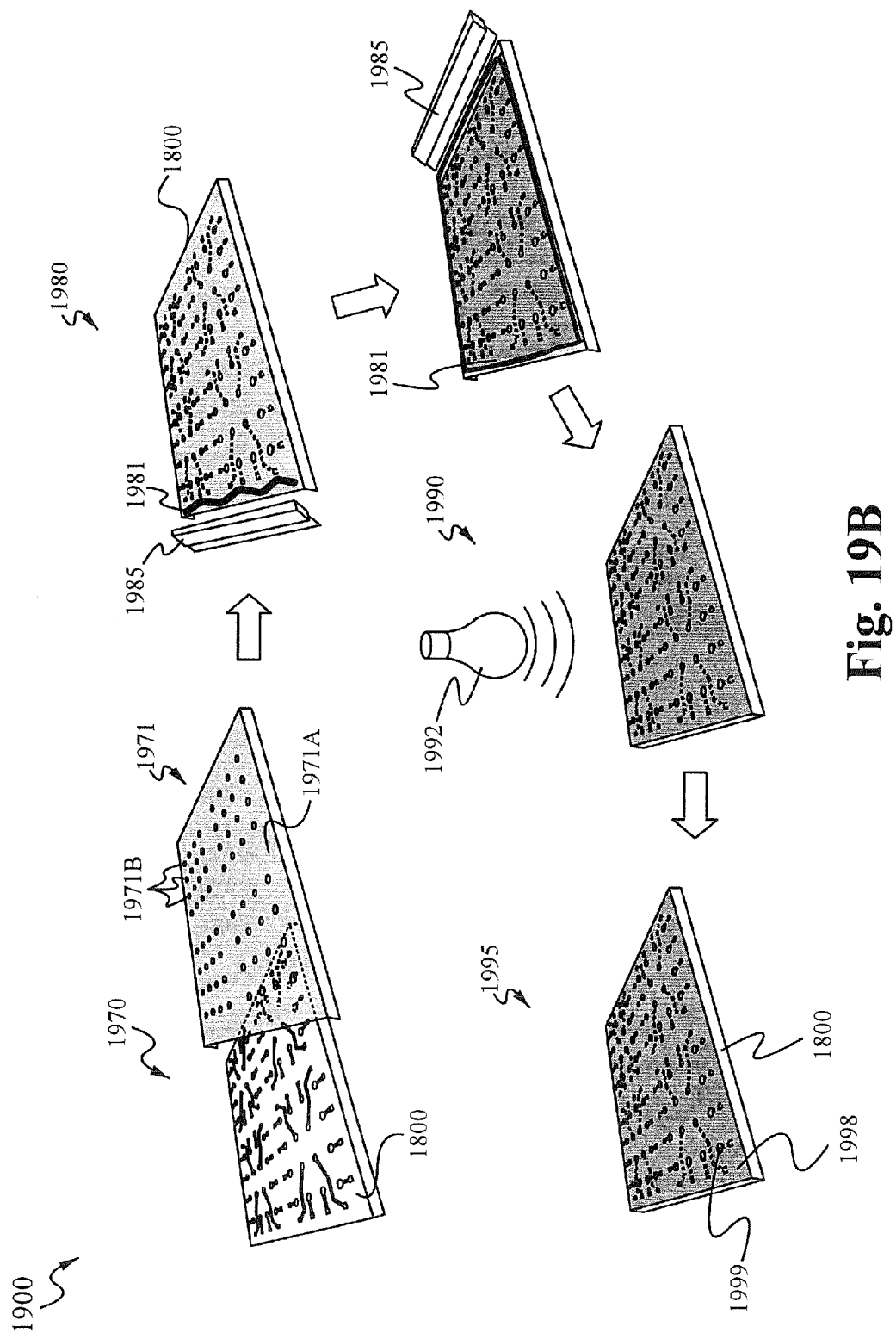
FIG. 19B illustrates a portion of a process for making the semiconductor package per an embodiment of this invention.

In some embodiments, the process moves on to FIG. 19B. Although a single semiconductor package 1800 is shown, the person of ordinary skill having the benefit of this disclosure will appreciate that the semiconductor packages are still in matrix form as in FIGS. 18 and 19A. FIG. 19B shows the semiconductor package 1800 of FIG. 18 having a solder resist epoxy applied thereon. In a step 1970, a screen 1971 is placed over surface of the semiconductor device 1800 having the contact traces thereon. The screen stencil 1971 has a permeable area 1971A that is permeable by a liquid substance and an impermeable area 1971B that is impermeable by a liquid substance. Preferably, the impermeable area 1971B is arranged such that it falls on the second ends of the contact traces 1835 of FIG. 18. In a later step 1980, solder resist epoxy 1981 is placed at one end of the semiconductor package 1800 and is smeared across the semiconductor package 1800 by a trowel 1985. The impermeable areas 1971B prevent the solder resist 1981 from coating the second ends of the contact traces 1835 of FIG. 18. In a later step 1990, a UV cure light 1992 cures the solder resist epoxy. What results in a step 1995 is a semiconductor package 1800 having a solder resist epoxy layer 1998 having openings 1999 for placing solder bumps or solder balls as explained further below. Alternatively, a solder resist film can be used rather than a solder resist epoxy over a screen stencil as shown in FIG. 20A.

Figure 20A:
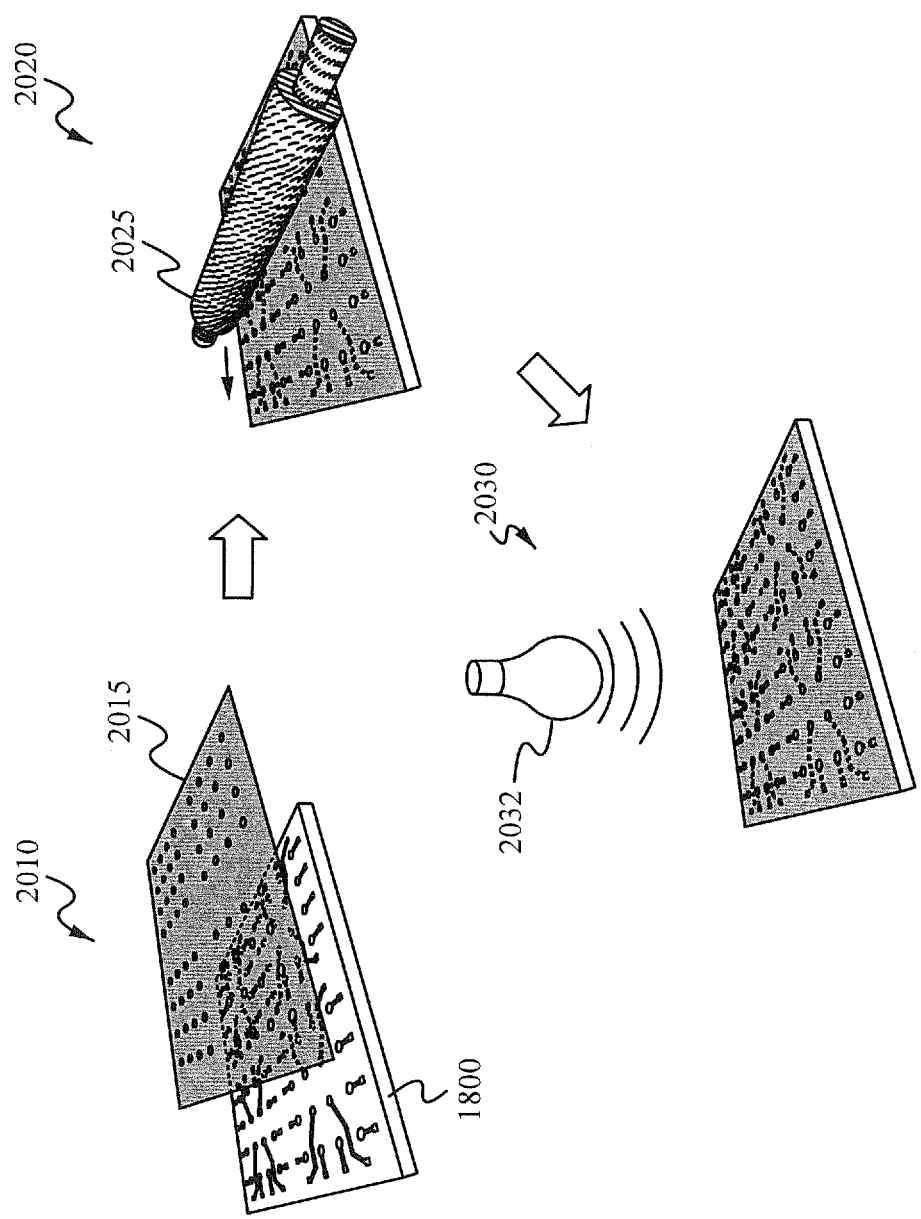
FIG. 20A illustrates a portion of a process for making the semiconductor package per an embodiment of this invention.
Figure 20B:
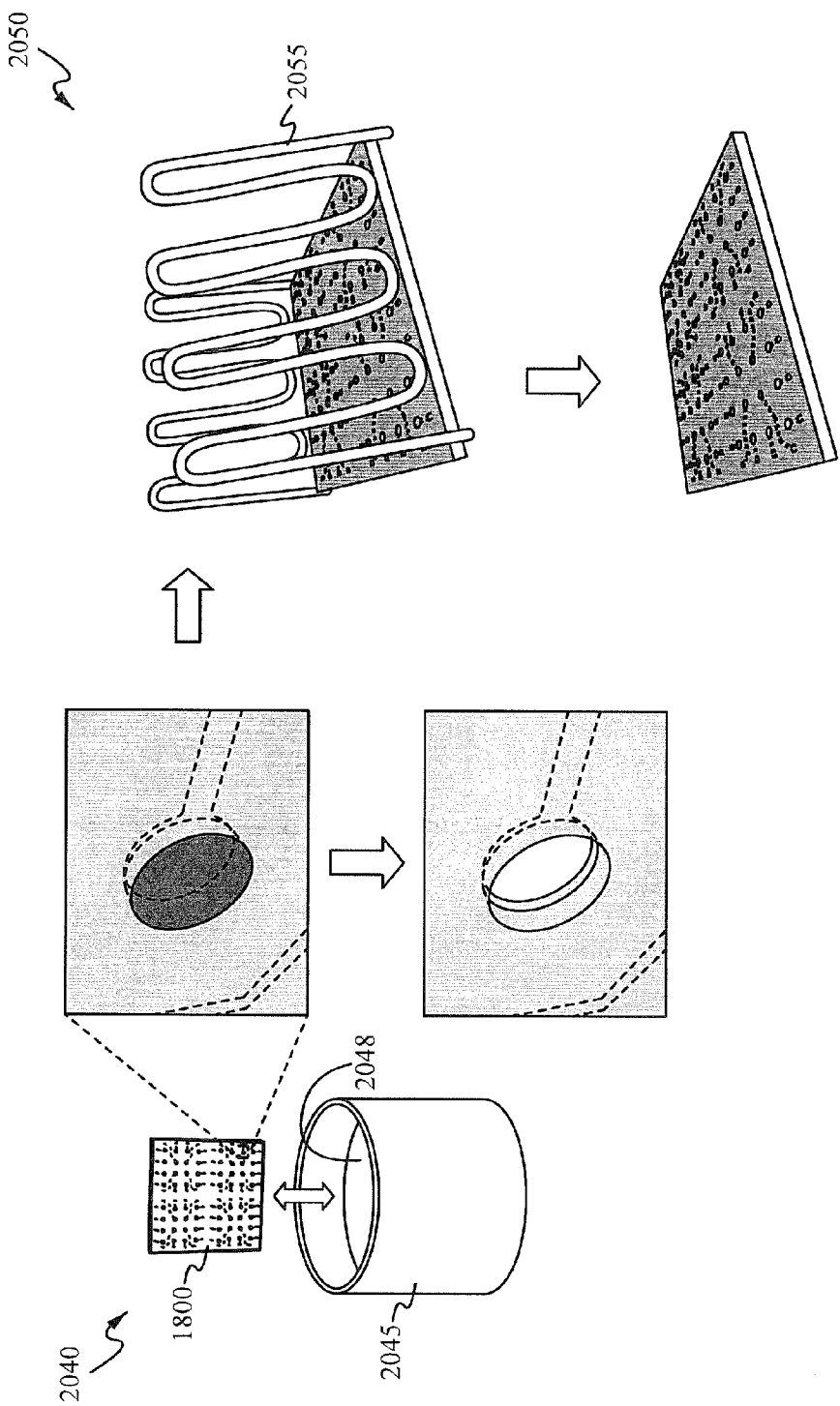
FIG. 20B illustrates a portion of a process for making the semiconductor package per an embodiment of this invention.

In FIG. 20A, the semiconductor package 1800 is shown having a solder resist film applied thereon. The solder resist film 2015 is shown being lowered onto the semiconductor package 1800 in a step 2010. In a later step 2020, the solder resist film 2015 is applied to the semiconductor package 1800 by some means for applying pressure. In the example of FIG. 20A, a rolling pin 2025 is shown. Those of ordinary skill having the benefit of this disclosure will recognize several means and methods of applying the solder resist film 2015 onto the semiconductor package 1800. In a later step 2030, the solder resist film 2015 is cured by UV light from a UV light source 2032. The process continues in FIG. 20B. In a step 2040, the semiconductor package 1800 is dipped into a vat 2045 having etching material 2048. During exposure to the development material 2048, portions that are uncovered by the solder resist film 2015 are exposed to the etching material 2048. After exposure, those portions are removed. In a later step 2050, the solder resist film 2025 is cured. In the example provided, heating elements 2055 provide heat for the curing step.

Figure 21A:
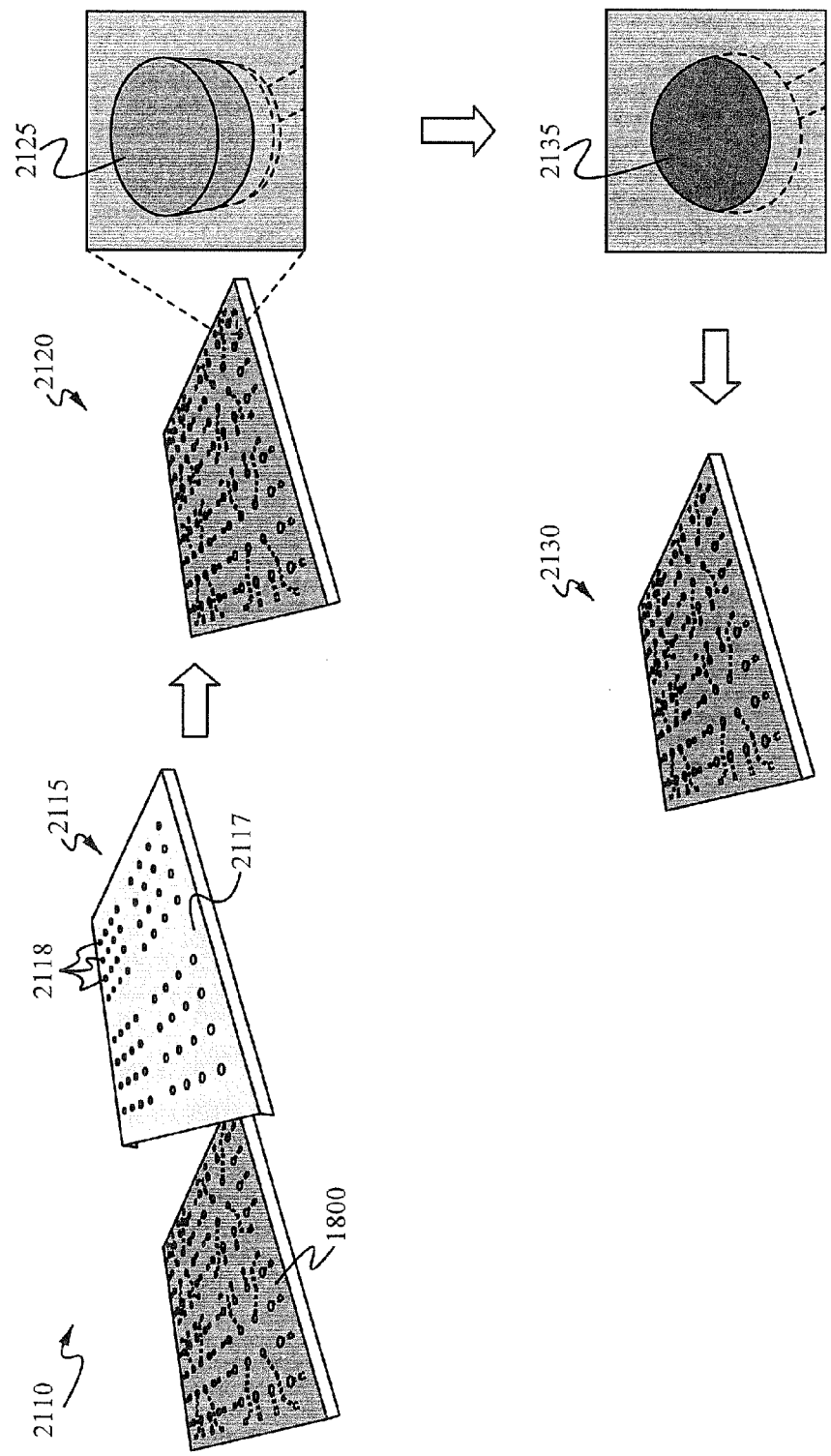
FIG. 21A illustrates a portion of a process for making the semiconductor package per an embodiment of this invention.
Figure 21B:
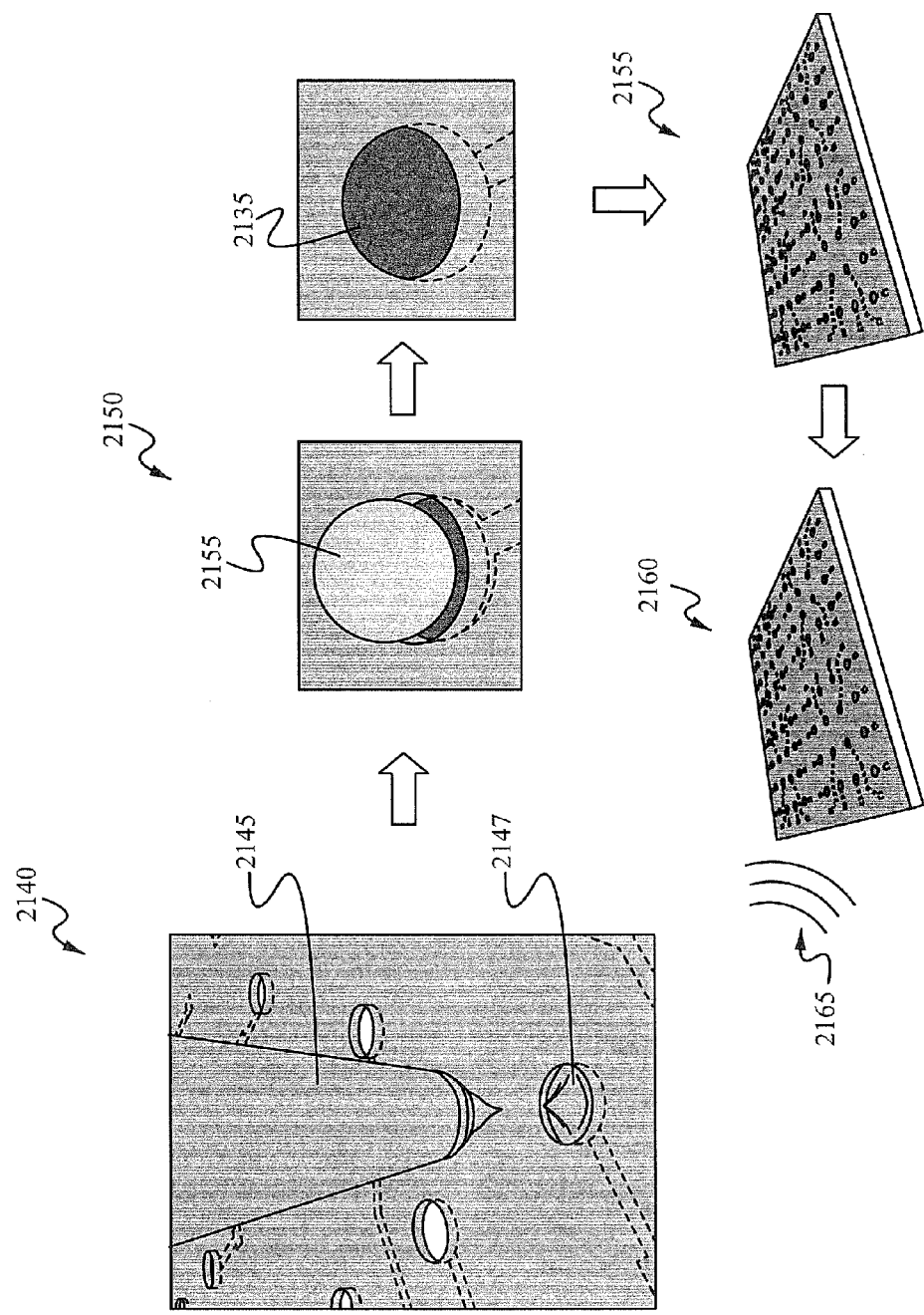
FIG. 21B illustrates a portion of a process for making the semiconductor package per an embodiment of this invention.

FIGS. 21A and 21B show exemplary process steps of attaching solder bump balls to the semiconductor package per an embodiment of this invention. FIG. 21A shows the process steps of implementing a screen for applying solder bump balls. In a step 2110, a screen is placed over the semiconductor package 1800. The screen 2115 has a solid metal area 2117 that is impenetrable by liquid solder, and an array of openings 2118. Preferably, the openings 2118 are positioned such that when the screen 2115 is placed over the semiconductor device 1800, the openings 2118 coincide with the second ends of the contact pads 1835 of FIG. 18. In a later step 2120, solder paste is applied. In some embodiments, the solder paste is in mix of solder and flux. The solder paste rolls off the solid metal area 2117 and settles in the portions left bare by the openings 2118. What results is a solder paste bump 2125 that is electrically coupled to the second end of the contact trace 1835 of FIG. 18. In a later step 2130, heat is applied to the solder paste bumps 2125, causing the flux within the solder paste to flow away, and the solder paste bump 2125 melts and assumes a round shape. What results is a solder bump ball 2135. The solder bump ball 2135 serves as an adhesive and a means for forming an electrical contact with an end application, such as a printed circuit board. FIG. 21B shows an alternate process for forming solder bump balls. An extruder 2145 drops solder flux 2147 into the areas not covered by the solder resist film 2025 of FIGS. 20A and 20B. As described above, these portions coincide with the second ends of the contact traces 1835 of FIG. 18. Then, solid solder balls 2155 are placed above the solder flux 2147. In one exemplary method, the semiconductor package 1800 is agitated or vibrated while solder balls are poured upon the surface having the solder resist film 2025. Eventually, all the portions having solder flux 2147 are filled with a solder ball 2155 when the solder ball 2155 becomes stuck in the solder flux 2147. In a later step 2160, the solder balls 2155 are exposed to heat 2165, forcing out the flux 2147 and causing the solder balls to melt and assume a form fitting shape into the open portions. Finally, in a singulation step 2170, a saw 2175 separates the matrix and an individual semiconductor package 1800 is formed.

VII. Support Structures

Figure 22:
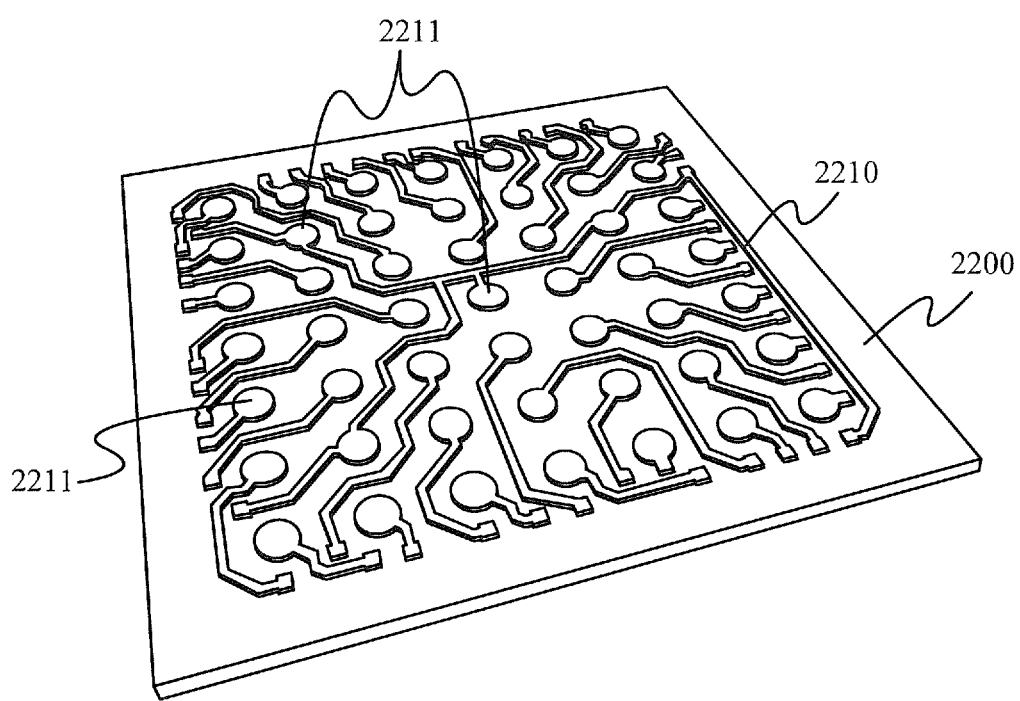
FIG. 22 shows a plated leadframe per an embodiment of this invention.

As discussed above, current technologies require a large number of I/O available for a semiconductor device. Semiconductor packages having a greater number of I/O, or contact points, have been developed. However, with increased number of I/O comes an increase in the form factor. To that end, a high density plated pattern of contact traces per an embodiment of this invention is shown in FIG. 22. A metal substrate 2200, such as copper, has several contact traces 2210 plated thereon by a process such as the one described in the above Figures. The contact traces 2210 have several end points 2211 for making multiple external contacts with. This allows for greater density of I/O in a final application. However, as density increases, the contact traces 2210 are made thinner, which may lead to the contact traces 2210 peeling from the semiconductor package as the package is heated during the reflow steps mentioned above or when the semiconductor package is heated during a later mounting step.

Figure 21C:
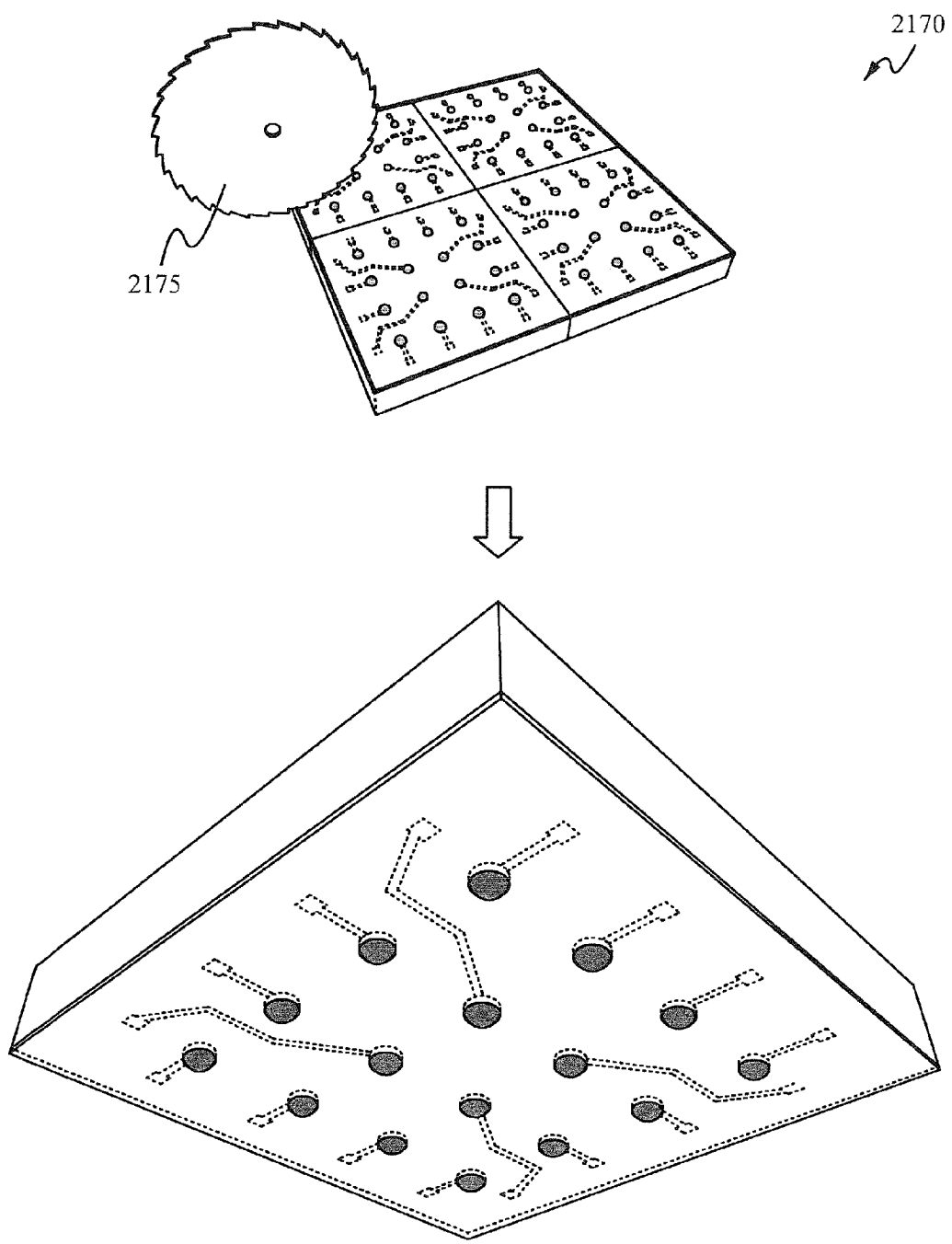
FIG. 21C illustrates a portion of a process for making the semiconductor package per an embodiment of this invention.
Figure 23:
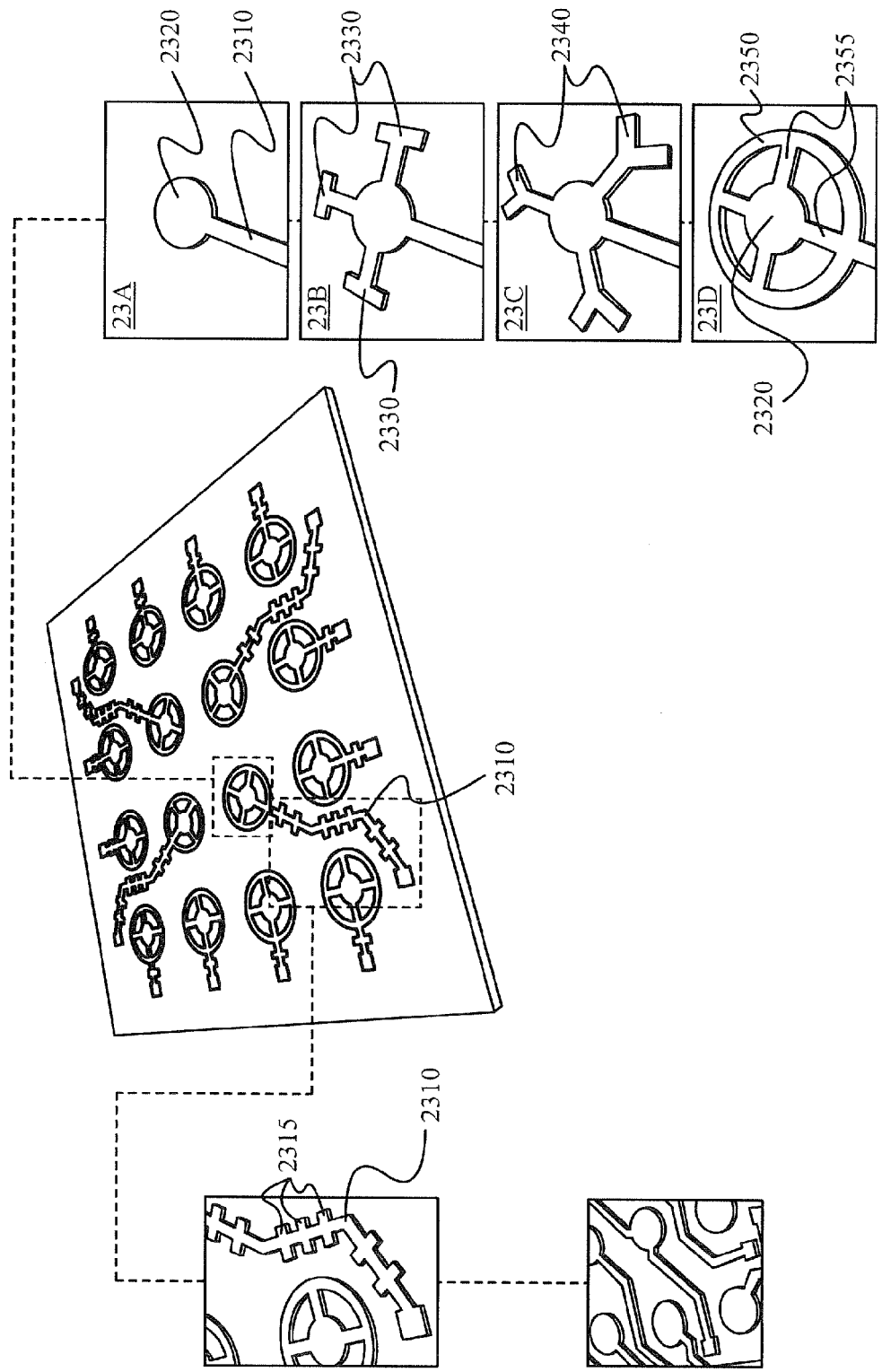
FIG. 23 shows platted leadframes having support structures per an embodiment of this invention.

To that end, FIG. 23 shows the traces 2210 and end points 2211 of FIG. 21 having various support structures to reduce peeling during process steps in manufacturing and application that involve heating the semiconductor package. FIG. 23 shows one embodiment wherein the perimeter of the contact trace 2310 comprises several support structures 2315 emanating outward therefrom. The support structures 2315 increase the adhesion of the contact traces 2310 to the eventual semiconductor die when it is completed. In the example provided, the support structures 2315 are represented as generally rectangular protrusions integrated with the contact trace 2310. However, the person of ordinary skill having the benefit of this disclosure will recognize that many shapes can be used as applications require. The shape should be chosen, among other factors, according to how densely the contact traces 2310 are placed and the size of the semiconductor die that is to be used. The shapes can have linear features, such as the rectangles shown, or arcuate features, such as half circuits, ovoids, or any other rounded shape. FIG. 23 shows exemplary support structures for the ends of the contact traces. The first (right topmost) image shows a bare contact trace end 2320, similar to the second end 1835 of FIG. 18. In some applications, an enlarged area at the end of the contact trace 2310 suffices as a support structure to prevent peeling. In the embodiment shown, the enlarged area is bulbous and round, but as mentioned above can take any appropriate shape for a particular application. The second image, below the first image, shows three additional support structures emanating from the contact end 2320. The exemplary shapes of the support structures 2330 are linear in nature and form three Ts. The third image, below the second image, shows "Y" shapes for the support structures 2340. Although a greater area consumed by the support structures 2340 can further reduce the likelihood of peeling, the greater area also reduces the available surface area for a maximum density of the contact traces 2310. To that end, the last (right bottommost) image shows an arcuate support structure 2350. Advantageously, the arcuate support structure 2350 provides more surface area for contacting the mold compound (not shown) and thereby providing greater adhesion. In the example shown, the support structure 2350 completely circumscribes the contact trace end 2320 and is integrated by tying bridges 2355. However, the arcuate support structure 2350 can also be shaped such that it partially circumscribes the contact trace end 2320. Advantageously, all of these support structures mentioned can be plated along with the contact traces 2310 in the same process steps as described in the previous Figures. The plating patterns discussed above, such as in step 1920 of FIG. 19 can be altered to include the support structures. As a result, no additional process steps are needed to include the support structures, and only an incremental increase in materials. As a result, any cost increase due to the support structures will be insignificant.

Figure 24:
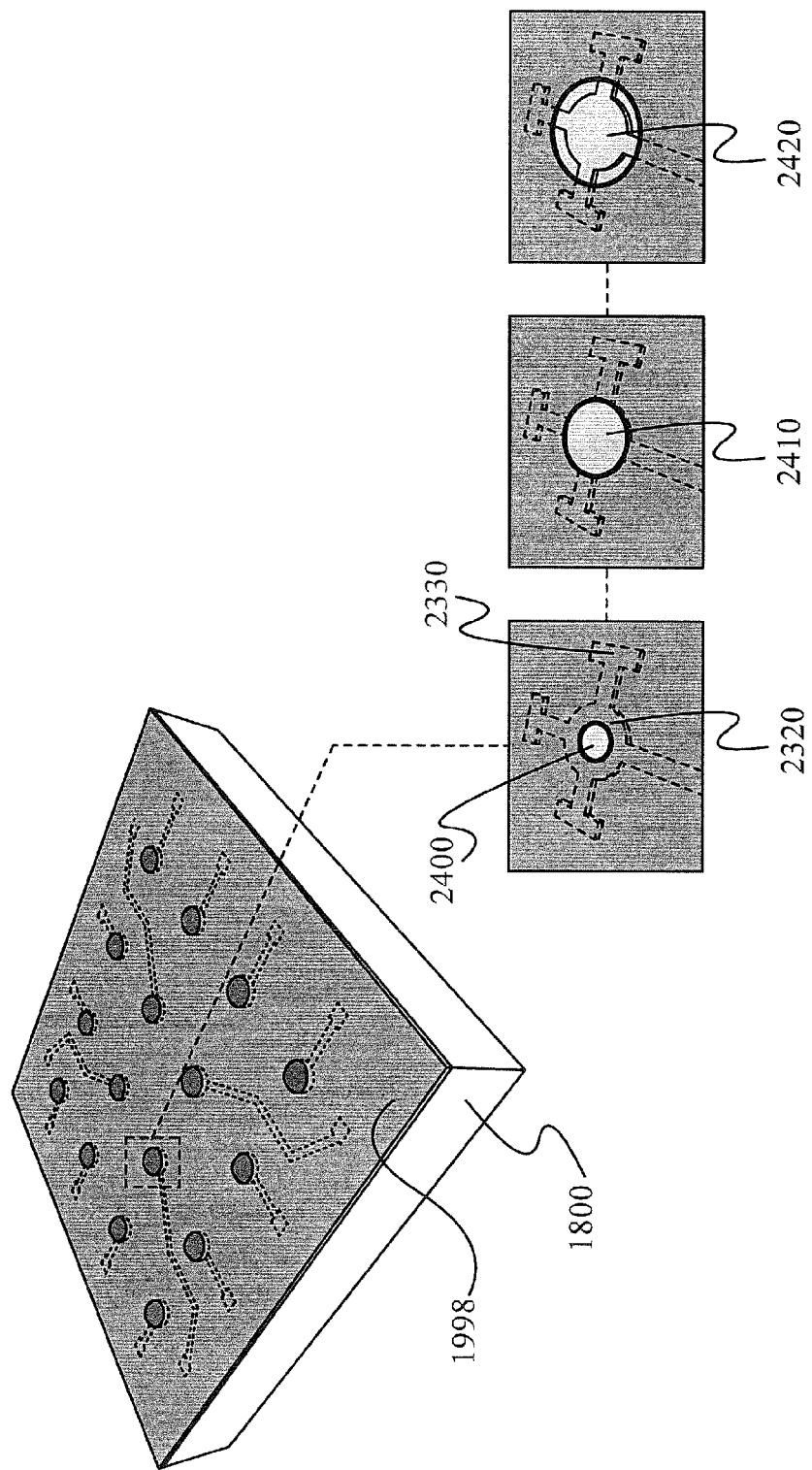
FIG. 24 shows a sealant or passivation layer over a leadframe per an embodiment of this invention.

In general, end manufacturers that use semiconductor devices in packages such as the one described in the above drawings have a certain pitch requirement between contact traces and the ends of the contact traces. In general, a semiconductor package has solder bumps or balls mounted on a surface that contacts an end application, such as a printed circuit board. The semiconductor package is heated to melt the solder which then makes a physical and electrical connection with the end application. However, end users' manufacturing tolerances vary widely, and as a result some minimum distance, or pitch between the contact traces or their ends is specified by the end user. As can be seen from the embodiments of FIG. 23, the support structures can cause the contact traces and their ends to be closer together. To that end, the solder flux screening methods shown in FIGS. 19B-20B preferably have openings (such as 1999 of FIG. 19) that conform to the pitch requirements of an end user. FIG. 24 shows the semiconductor device 1800 having the solder resist layer 1998 (from FIGS. 18 and 19, respectively). As an example, the support structure 2330 of FIG. 23B is shown under the solder resist layer 1998. Although a solder resist layer is shown and discussed herein, those of ordinary skill having the benefit of this disclosure will readily recognize that other passivation means and methods can be employed to form an electric separation between the semiconductor die 1800 and an end application or to form a barrier to solder. The opening 2400 in the solder resist layer can be made smaller than the end of the contact trace. Alternatively, another opening 2410 is shown being the same size as the end of the contact trace 2410. Still alternatively, the opening 2420 is larger. In some embodiments, the size of the openings 2400, 2410, and 2420 is determined by the pitch requirement of the end user.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A method of forming a semiconductor package comprising:
   a. plating a plurality of contact traces on a metal substrate, each contact trace having a first end and a second end and a pathway between the first end and the second end, wherein the first end is wider than the pathway;
   b. mounting semiconductor die substantially above the second ends of the contact traces;
   c. electrically coupling the semiconductor die to at least one first end of at least one contact trace;
   d. encapsulating the semiconductor die in an encapsulant;
   e. removing the metal substrate, thereby exposing the contact traces; and
   f. singulating the semiconductor package.

2. The method of claim 1, further comprising forming at least one support structure about the second end of at least one contact trace.

3. The method of claim 2, wherein forming support structures comprises forming at least one plated area extending outward from the second end of the at least one contact trace.

4. The method of claim 2, wherein forming support structures comprises forming at least one plated area substantially circumscribing the second end of the at least one contact trace.

5. The method of claim 2, wherein forming support structures comprises forming at least one plated area having a substantially arcuate shape.

6. The method of claim 2, wherein forming support structures comprises forming at least one plated area having a substantially linear shape.

7. The method of claim 1, wherein the metal substrate comprises copper.

8. The method of claim 1, wherein plating a plurality of contact traces comprises plating layers comprising palladium, gold, and nickel.

9. A method of forming a semiconductor package comprising:
   a. plating a plurality of contact traces on a metal substrate, wherein the contact traces comprise a plurality of plated layers, each contact trace having a first end and a second end and a pathway between the first end and the second end, wherein the first end is wider than the pathway;
   b. electrically coupling a first semiconductor die substantially above at least a portion of the contact traces;
   d. encapsulating at least a portion of the plurality of contact traces and the first semiconductor die in an encapsulant;
   e. removing the metal substrate, thereby exposing the contact traces; and
   f. singulating the semiconductor package.

10. The method of claim 9, further comprising coupling a second semiconductor die with the first semiconductor die, wherein the second semiconductor die is coupled with the first end of at least one contact trace by a bondwire.

11. The method of claim 9, further comprising coupling a second semiconductor die with the first semiconductor die, wherein the second semiconductor die is coupled with the first end of at least one contact trace by a solder bump.

12. The method of claim 9, further comprising coupling a second semiconductor die with the first semiconductor die by a bondwire.

13. The method of claim 9, further comprising coupling a second semiconductor die with the first semiconductor die by a solder bump.

14. The method of claim 9, further comprising plating a die attach pad on the metal substrate, wherein the die attach pad receives the first semiconductor die, wherein the die attach pad comprises a plurality of plated layers.

15. A method of forming a semiconductor package comprising:
   a. plating a plurality of contact traces on a metal substrate, wherein the contact traces comprise a plurality of plated layers, each contact trace having a first end and a second end and a pathway between the first end and the second end, wherein the first end is wider than the pathway;
   b. electrically coupling the first end of at least one contact trace to an active surface of a semiconductor die;
   d. encapsulating at least a portion of the semiconductor die and plurality of contact;

e. removing the metal substrate, thereby exposing the contact traces; and f. singulating the semiconductor package.

16. The method of claim 15, wherein the plating a plurality of contact traces includes forming a plurality of supports about the second ends of the plurality of contact traces.

17. The method of claim 16, wherein the at least one support structure includes a rectangular protrusion integrated with the contact trace.

18. The method of claim 15, wherein the pathway has at least one support structure that emanates outward therefrom.

19. The method of claim 15, wherein a contact pad is located at the first end and an end point is located at the second end.

20. The method of claim 15, further comprising applying solder resist epoxy on a side with the exposed contact traces without coating each second end in its entirety.

* * * * *